US007965217B2

(12) United States Patent
Murden et al.

(10) Patent No.: US 7,965,217 B2
(45) Date of Patent: Jun. 21, 2011

(54) APPARATUS AND METHOD FOR PIPELINED ANALOG TO DIGITAL CONVERSION

(75) Inventors: Franklin Murden, Roan Mountain, TN (US); Scott G. Bardsley, Gibsonville, NC (US); Peter R. Derounian, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/578,076

(22) Filed: Oct. 13, 2009

(65) Prior Publication Data
US 2011/0084860 A1 Apr. 14, 2011

(51) Int. Cl.
H03M 1/38 (2006.01)
(52) U.S. Cl. .................. 341/161; 341/162; 341/172
(58) Field of Classification Search ................ 341/161
See application file for complete search history.

(56) References Cited

U.S. PATENT DOCUMENTS

| | | | |
|---|---|---|---|
| 4,779,059 A | 10/1988 | Taki et al. | |
| 5,635,937 A | 6/1997 | Lim et al. | |
| 6,259,392 B1 | 7/2001 | Choi et al. | |
| 6,366,230 B1 | 4/2002 | Zhang et al. | |
| 6,756,929 B1 | 6/2004 | Ali | |
| 6,822,601 B1 | 11/2004 | Liu et al. | |
| 6,861,969 B1 * | 3/2005 | Ali ............. | 341/161 |
| 6,876,318 B2 | 4/2005 | Mulder et al. | |
| 7,106,106 B2 | 9/2006 | Hughes | |
| 7,265,703 B2 * | 9/2007 | Sasaki et al. ............ | 341/161 |
| 7,397,409 B2 | 7/2008 | Jeon et al. | |
| 7,456,775 B2 * | 11/2008 | Chen ............. | 341/161 |
| 7,551,115 B2 * | 6/2009 | Bailey et al. ............ | 341/161 |
| 7,561,095 B2 * | 7/2009 | Sasaki et al. ............ | 341/161 |
| 7,570,082 B2 | 8/2009 | Gebara et al. | |
| 7,646,324 B2 * | 1/2010 | Matsubayashi ............ | 341/161 |
| 2009/0153196 A1 | 6/2009 | Gebara et al. | |

OTHER PUBLICATIONS

Taherzadeh-Sani et al., "Digital Background Calibration of Capacitor-Mismatch Errors in Pipelined ADCs," IEEE Transactions on Circuits and Systems—II: Express Briefs, Sep. 2006, pp. 966-970, vol. 53, No. 9.
Maxim, Understanding Pipelined ADC's, available at http://www.maxim-ic.com/appnotes.cfm/appnote_number/1023/, pp. 1-6, Oct. 2, 2001.
Office Action dated Nov. 16, 2010, received in U.S. Appl. No. 12/578,057.

* cited by examiner

*Primary Examiner* — Khai M Nguyen
(74) *Attorney, Agent, or Firm* — Knobbe Martens Olson & Bear LLP

(57) ABSTRACT

Apparatus and methods for pipelined analog-to-digital conversion are disclosed. In some embodiments, a pipelined analog-to-digital converter includes a control and correction circuit; and a plurality of MDAC stages. At least one of the MDAC stages includes: an MDAC input to receive an analog input voltage; and a dual latch flash ADC comprising one or more dual latch comparators. At least one of the dual latch comparators includes: a pre-amplifier having an input coupled to the MDAC input, and an output; a demultiplexer having an input coupled to the output of the pre-amplifier, a first output, and a second output; a first latch having an input coupled to the first output of the demultiplexer, wherein the first latch may generate a first digital signal; and a second latch having an input coupled to the second output of the demultiplexer, wherein the second latch may generate a second digital signal.

26 Claims, 19 Drawing Sheets

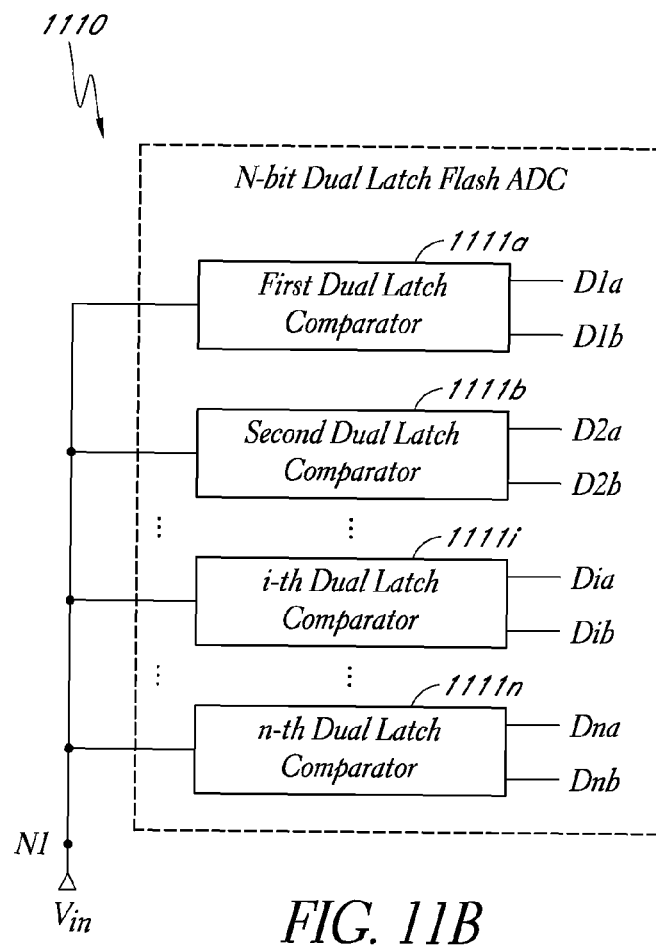
FIG. 11B
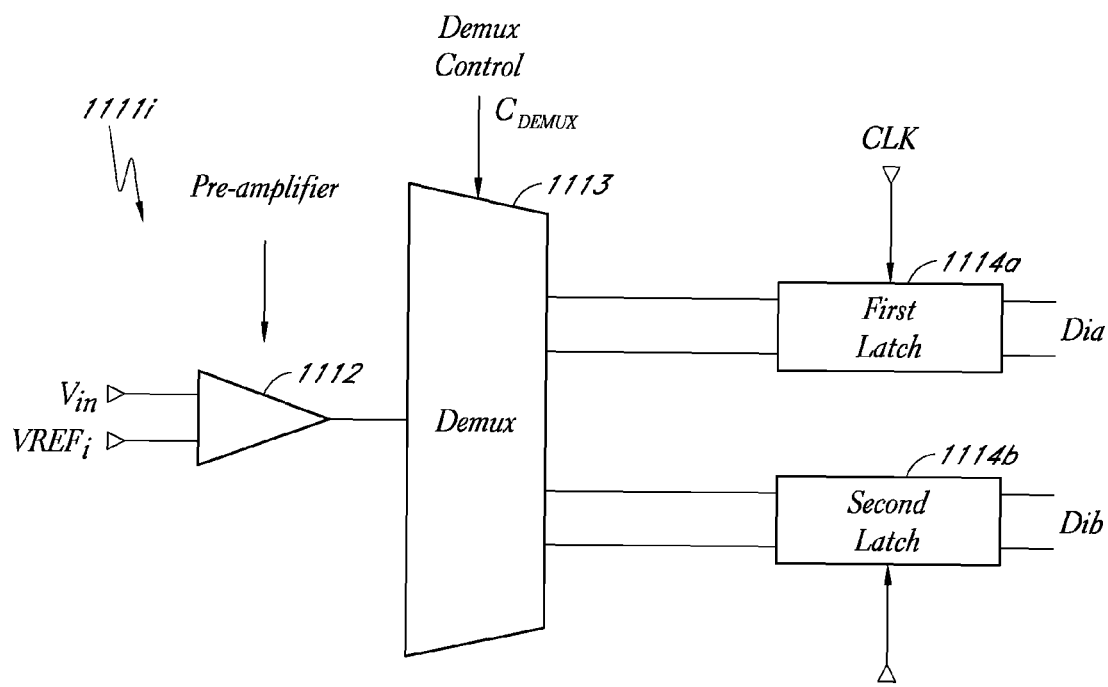
FIG. 11C  i-th Dual Latch Comparator

APPARATUS AND METHOD FOR PIPELINED ANALOG TO DIGITAL CONVERSION

CROSS-REFERENCE TO RELATED APPLICATIONS

This application is related to APPARATUS AND METHOD FOR PIPELINED ANALOG TO DIGITAL CONVERSION (Inventors: Franklin Murden et al.; Ser. No. 12/578,057, filed on even date herewith), the disclosure of which is incorporated by reference in its entirety.

BACKGROUND

1. Field

Embodiments of the invention relate to electronic devices, and more particularly, in one or more embodiments, to analog-to-digital converters.

2. Description of the Related Technology

In certain electronic devices, analog-to-digital converters (ADCs) are used for converting an analog signal into a digital format. Examples of such electronic devices include, but are not limited to, imaging devices, communication devices, and display devices.

An analog-to-digital converter (ADC) can use one of several architectures, such as serial architecture, delta-sigma architecture, and pipelined architecture. Among the ADC architectures, the pipelined architecture is widely used in applications, such as video imaging systems, digital subscriber loops, Ethernet transceivers, and wireless communications. The pipelined ADC is also known as a sub-ranging ADC.

Referring to FIG. 1A, one example of a conventional pipelined analog-to-digital converter (ADC) will be described below. The illustrated pipelined ADC 100 includes first to N-th multiplying digital-to-analog converter (MDAC) stages 110-140 coupled in cascade, and a control and correction logic 150.

The first MDAC stage 110 receives an analog input signal $V_{IN}$, and generates a first n-bit digital signal D1 that forms the most significant bits (MSB) of a resulting digital output signal $D_{OUT}$. The first MDAC stage 110 also outputs a first residue analog signal $V_1$ to the second stage 120. Similarly, the second MDAC stage 120 receives the first residue analog signal $V_1$, and generates a second n-bit digital signal D2 that forms the second most significant bits (MSB) of the digital output signal $D_{OUT}$. The second MDAC stage 120 also outputs a second residue analog signal $V_2$ to the next stage.

Likewise, the i-th MDAC stage 130 receives a residue analog signal $V_{i-1}$ from an immediately preceding stage, and generates an i-th n-bit digital signal Di that forms part of the digital output signal $D_{OUT}$. The i-th MDAC stage 130 also outputs an i-th residue analog signal $V_i$ to the next stage. The last and N-th MDAC stage 140 receives a residue analog signal $V_{N-1}$ from an immediately preceding stage, and generates an N-th n-bit digital signal $D_N$ that forms the least significant bit (LSB) of the digital output signal $D_{OUT}$.

Referring to FIG. 1B, one example of the configuration of an MDAC stage of the pipelined ADC 100 of FIG. 1A will be described below. The illustrated stage is the i-th stage 130 of FIG. 1A. A skilled artisan will, however, appreciate that the other MDAC stages of the pipelined ADC 100 of FIG. 1A can have the same or similar configuration.

The MDAC stage 130 includes an analog-to-digital converter (ADC) 132, a digital-to-analog converter (DAC) 134, a summation block 136, and an amplifier 138. The ADC 132 converts the (i−1)-th residue analog signal $V_{i-1}$ from the immediately preceding stage into the i-th n-bit digital signal Di. The DAC 134 converts the i-th n-bit digital signal Di into an analog signal Ai corresponding to the digital signal Di. The summation block 136 subtracts the analog signal Ai from the residue analog signal $V_{i-1}$, and provides a resulting signal to the amplifier 138. The amplifier 138 amplifies the resulting signal by a gain $G_i$ to output the i-th residue signal to the next stage. The ADC 132, the DAC 134, the summation block 136, and the amplifier 138 can be implemented as a circuit block to form an MDAC.

Referring now to FIG. 2A, one example of a circuit that can form a stage of the pipelined ADC 100 of FIG. 1A will be described below. For clarity, the case of 1-bit is described, and a comparator is used for the ADC 210. However, in practical circuits, multiple bits are used. The illustrated circuit 200 includes a 1-bit flash ADC 210, a capacitor block 220, an amplifier 230, an amplifier capacitor Camp, a first switch SW1, an output switch SW0, and first to fifth nodes N1-N5.

The 1-bit flash ADC 210 serves to quantize an input analog voltage Vin (or a residue analog voltage from an immediately preceding stage) to one bit. The flash ADC 210 includes a voltage comparator 212 that includes a non-inverting input 212a, an inverting input 212b, and an output 212c. The non-inverting input 212a is coupled to the first node N1 configured to receive the input analog voltage Vin. The inverting input 212b is coupled to a voltage reference, ground in the illustrated example. In a practical ADC 210, multiple comparators are present, and each can be coupled to a separate reference voltage. The output 212c is coupled to the fourth node N4, and is configured to output a digital output signal Do. The fourth node N4 is coupled to the control and correction logic 150 (FIG. 1A) and the capacitor block 220.

The capacitor block 220 includes a second switch SW2, a first reference switch rsw1, a second reference switch rsw2, and a capacitor C1. The second switch SW2 is coupled between the first node N1 and the fifth node N5, and switches on or off at least partly in response to an analog-to-digital converter (ADC) clock signal ADC CLK. Operation of these switches will be described later.

The first reference switch rsw1 is coupled between the fifth node N5 and a first reference voltage source VREF1. The first reference voltage source VREF1 can have a voltage value of $+V_{FS}/2$, where $V_{FS}$ represents a positive full-swing voltage value. The second reference switch rsw2 is coupled between the fifth node N5, and a second reference voltage source VREF2 having a voltage value of $-V_{FS}/2$. The first and second reference switches rsw1, rsw2 switch on or off at least partly in response to the digital output signal Do. Operation of these switches will be described later. The capacitor C1 is coupled between the fifth node N5 and the second node N2.

The amplifier 230 includes an inverting input coupled to the second node N2, a non-inverting input coupled to ground, and an output coupled to the third node N3. The amplifier capacitor Camp includes a first terminal coupled to the second node N2, and a second terminal coupled to the third node N3.

The first switch SW1 is coupled between the second node N2 and ground, and switches on (low resistance) or off (high resistance) at least partly in response to the ADC clock signal ADC CLK. The output switch SW0 is coupled between the third node N3 and ground.

During a first phase (which may be referred to as "sample phase") of the operation of the circuit 200 (for example, while the clock signal ADC CLK is low), the input analog voltage Vin is sampled across the capacitor C1 by switching on the first and second switches SW1, SW2, and the output switch SW0. The reference switches rsw1, rsw2 are turned off. During this phase, the comparator 212 is in a tracking mode.

During a second phase (which may be referred to as "hold phase") of the operation of the circuit 200 (for example, while the clock signal ADC CLK is high), the first and second switches SW1, SW2, and the output switch SW0 are switched off. During this phase, the comparator 212 is in a latch mode in which it determines whether the input analog voltage Vin is greater than the reference voltage, and outputs the digital output signal Do, based on the determination. In addition, an appropriate reference voltage, either $+V_{FS}/2$ or $-V_{FS}/2$, is applied to the capacitor C1 through either of the first and second reference switches rsw1, rsw2, depending on the digital output signal Do. The input voltage, Vin, is subtracted from either $+V_{FS}/2$ or $-V_{FS}/2$, depending on the output signal Do, and that difference charge is transferred to the amplifier capacitor Camp by the fact that the second node N2 is at virtual ground (due to the high open loop gain of the amplifier 230). The relationship between the input voltage Vin and the output voltage Vout is shown in FIG. 2B.

In general, the comparator 212 of FIG. 2A may include a pre-amplifier 310 and a latch 320, as shown in FIG. 3A. The pre-amplifier 310 serves to amplify the input analog voltage Vin and provide the amplified input analog voltage to the latch 320. The latch 320 receives the amplified difference between the input analog voltage Vin and a reference voltage, for example, 0V in the illustration. When a clock CLK provided to the latch 320 is high, the positive feedback of the latch 320 is suppressed by a first latch switch, for example, LTR1 in FIG. 3B. When the clock goes low, the first latch switch LTR1 turns off, and the positive feedback of the latch 320 takes the received difference voltage, and gains it up until one output goes to ground (logic 0) and the other to the supply (logic 1).

Referring now to FIG. 3B, one example of a circuit for the comparator 212 of FIG. 2A will be described below. The illustrated circuit 300 includes a pre-amplifier 310, a latch 320, and a current mirror 330.

The pre-amplifier 310 can include a first amplifier transistor ATR1, a second amplifier transistor ATR2, and a current source CS. The first amplifier transistor ATR1 includes a drain coupled to the current mirror 330, a source coupled to the current source CS, and a gate configured to receive one of the input analog voltage Vin and the reference voltage. The second amplifier transistor ATR2 includes a drain coupled to the current mirror 330, a source coupled to the current source CS, and a gate configured to receive the other of the input analog voltage Vin and the reference voltage. The current source CS is configured to generate a current flowing from the sources of the transistors ATR1, ATR2 to ground.

The latch 320 includes first to third latch transistors LTR1-LTR3, and first and second latch nodes LN1, LN2. The first latch transistor LTR1 includes a source/drain coupled to the first latch node LN1, a drain/source coupled to the second latch node LN2, and a gate configured to receive a clock signal CLK. The second latch transistor LTR2 includes a source/drain coupled to the first latch node LN1, a drain/source coupled to ground, and a gate coupled to the second latch node LN2. The third latch transistor LTR3 includes a source/drain coupled to the second latch node LN2, a drain/source coupled to ground, and a gate coupled to the first latch node LN1. The first and second latch nodes LN1, LN2 are configured to receive first and second current signals $i_1$ and $i_2$, respectively, from the current mirror 330.

The current mirror 330 serves to copy currents from the pre-amplifier 310, and provide the copied currents to the latch 320. A skilled artisan will appreciate that various configurations of current mirrors can be adapted for the current mirror 330.

During operation, each of the gates of the first and second amplifier transistors ATR1, ATR2 receives a respective one of the input analog voltage Vin and the reference voltage. Depending on the levels of the input analog voltage Vin and the reference voltage, the first and second amplifier transistors ATR1, ATR2 allow first and second amplifier currents $i_{a1}$, $i_{a2}$ to flow therethrough. The first and second amplifier currents $i_{a1}$, $i_{a2}$ are copied by the current mirror 330, and are provided to the latch 320 as first and second current signals $i_1$, $i_2$.

During a first phase of the operation of the comparator 212, the clock signal CLK is high. The first latch transistor LTR1 thus connects the first latch node LN1 to the second latch node LN2 so that the positive resistance of the LTR1 is lower in resistance than the magnitude of the negative resistance of the second and third latch transistors LTR2 and LTR3, thus keeping the latch 320 from regenerating. Some amount of the difference between the input signal Vin and the comparator reference will be seen across the first and second latch nodes LN1, LN2 by the currents $i_1$ and $i_2$.

During a second phase of the operation, the clock signal CLK goes low, and thus the first latch transistor LTR1 is turned off, disconnecting the first latch node LN1 from the second latch node LN2, thus allowing the difference signal to be exposed to the positive feedback of the latch 320. For example, when the first current signal $i_1$ is greater than the bias current Ib, and the second current signal $i_2$ is less than the bias current Ib, a transition is initiated to force the second latch transistor LTR2 to be in an "OFF" state, while the third transistor M3 remains in an "ON" state. It, however, takes some time (which is so-called "regeneration time") for the nodes LN1, LN2 to transition to a new steady state that is indicative of which one of the first and second current signals $i_1$ and $i_2$ is greater than the other. The smaller the voltage between the first and second latch nodes LN1 and LN2, the longer it takes for regeneration (the relationship between the difference in voltage between the first and second latch nodes LN1 and LN2 and the regeneration time is exponential). When the voltage is so small between the first and second latch nodes LN1 and LN2 that the latch 320 does not regenerate in the appropriate amount of time, the latch 320 is said to be in a meta-stable state, meaning that neither output $V_{OUT}$ or $V_{OUTb}$ has reached a valid logic level.

SUMMARY

In one embodiment, an apparatus comprises: a pipelined analog-to-digital converter comprising a control and correction circuit; and a plurality of multiplying digital-to-analog converter (MDAC) stages coupled in cascade to one another. At least one of the MDAC stages comprises: an MDAC input configured to receive an analog input voltage; a first flash analog-to-digital converter (ADC) having an input coupled to the MDAC input, wherein the first flash ADC is configured to generate a first digital signal; and a second flash ADC having an input coupled to the MDAC input, wherein the second flash ADC is configured to generate a second digital signal. The first flash ADC and the second flash ADC alternate analog-to-digital conversion in response to control from the control and correction circuit.

In another embodiment, an apparatus comprises: a pipelined analog-to-digital converter comprising a control and correction circuit; and a plurality of multiplying digital-to-analog converter (MDAC) stages coupled in cascade to one another. At least one of the MDAC stages comprises: an MDAC input configured to receive an analog input voltage; and a dual latch flash analog-to-digital converter (ADC) comprising one or more dual latch comparators. At least one of the dual latch comparators comprises: a pre-amplifier having an input coupled to the MDAC input, and an output; a demultiplexer having an input coupled to the output of the pre-amplifier, a first output, and a second output; a first latch having an input coupled to the first output of the demultiplexer, wherein the first latch is configured to generate a first digital signal; and a second latch having an input coupled to the second output of the demultiplexer, wherein the second latch is configured to generate a second digital signal. The first latch and the second latch alternate analog-to-digital conversion in response to control from the control and correction circuit.

In yet another embodiment, a method for pipelined analog-to-digital conversion is provided. The method comprises: converting a first analog signal into a digital signal; converting the digital signal into a second analog signal; subtracting the second analog signal from the first analog signal, thereby generating a residue signal; and amplifying the residue signal. Converting the first analog signal comprises: comparing, by a first flash analog-to-digital converter (ADC), the first analog signal with one or more reference voltages to generate a first digital signal during at least part of a first phase or cycle of a clock signal; comparing, by a second flash ADC, the first analog signal with the one or more reference voltages to generate a second digital signal during at least part of a second phase or cycle of the clock signal immediately subsequent to the first phase or cycle.

In yet another embodiment, a method for pipelined analog-to-digital conversion is provided. The method comprises: converting a first analog signal into a digital signal; converting the digital signal into a second analog signal; subtracting the second analog signal from the first analog signal, thereby generating a residue signal; and amplifying the residue signal. Converting the first analog signal comprises: pre-amplifying, by a pre-amplifier of a flash ADC, the first analog signal and a reference voltage; comparing, by a first comparator latch of the flash ADC, the pre-amplified first analog signal with the pre-amplified reference voltage to generate a first digital signal during at least part of a first phase or cycle of a clock signal; and comparing, by a second comparator latch of the flash ADC, the pre-amplified first analog signal with the pre-amplified reference voltage to generate a second digital signal during at least part of a second phase or cycle of a clock signal immediately subsequent to the first phase or cycle.

BRIEF DESCRIPTION OF THE DRAWINGS

FIG. 11B is a schematic block diagram of the dual latch flash ADC of FIG. 11A according to one embodiment.

FIG. 11C is a schematic block diagram of a dual latch comparator in the dual latch flash ADC of FIG. 11B according to one embodiment.

DETAILED DESCRIPTION OF EMBODIMENTS

Figure 1A:
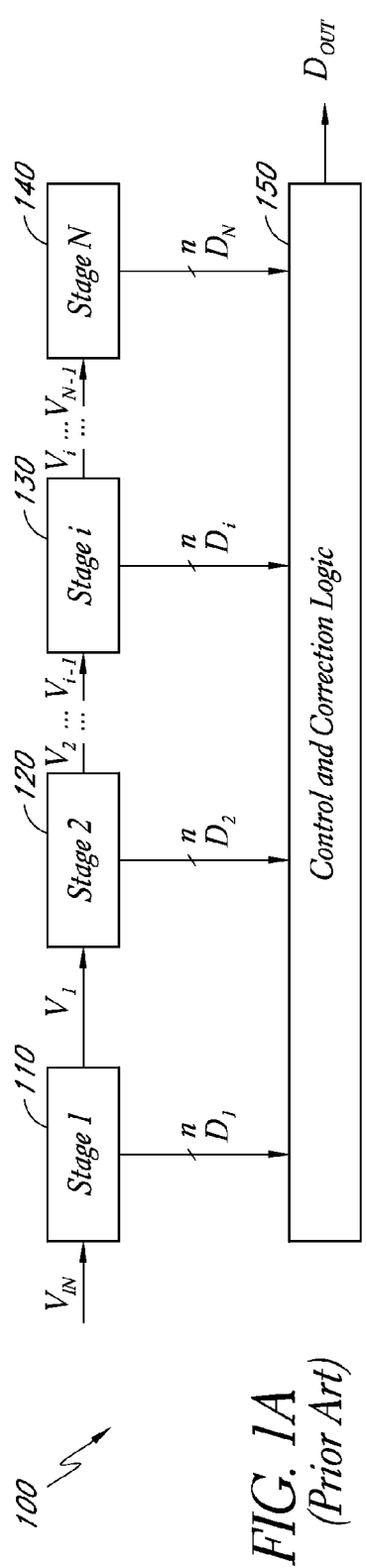
FIG. 1A is a schematic block diagram illustrating a conventional pipelined analog-to-digital converter (ADC) including multiple stages coupled in cascade.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Figure 3A:
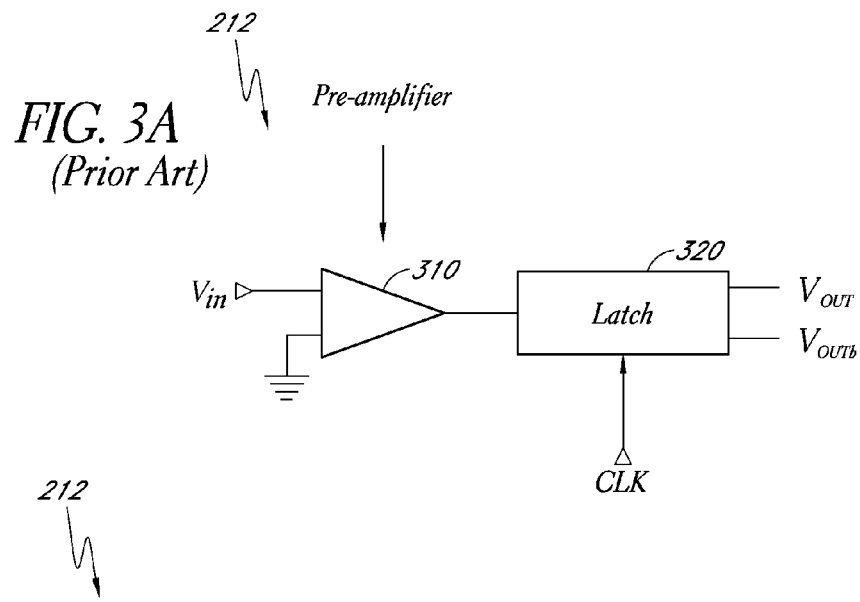
FIG. 3A is a block diagram of one example of a comparator in the MDAC of FIG. 2A.
Figure 3B:
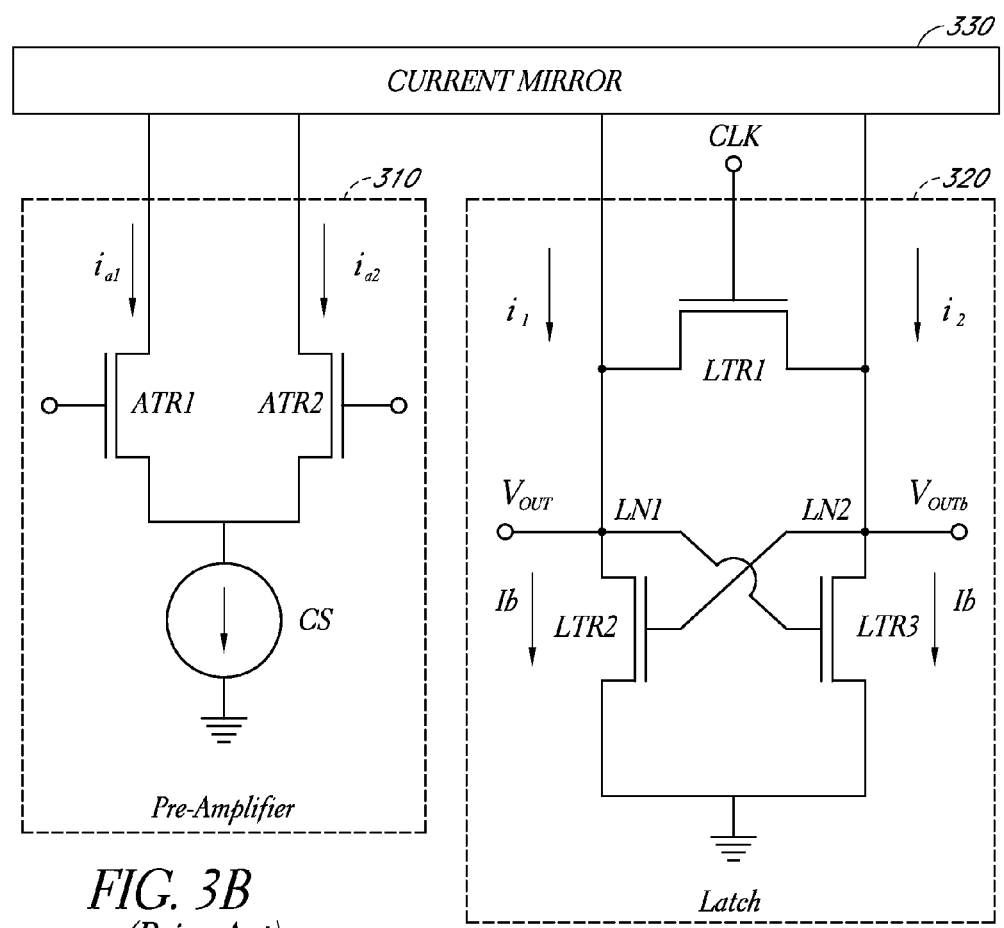
FIG. 3B is a circuit diagram of one example of a comparator in the MDAC of FIG. 2A.

As described above, an MDAC stage includes one or more comparators for converting an input analog voltage into a digital signal. Such comparators, not limited to the comparator 212 shown in FIG. 3B, typically have regeneration time described above. The regeneration time of comparators in a pipelined ADC often shortens a gain time during which an MDAC stage can output a residue analog signal.

Figure 2A:
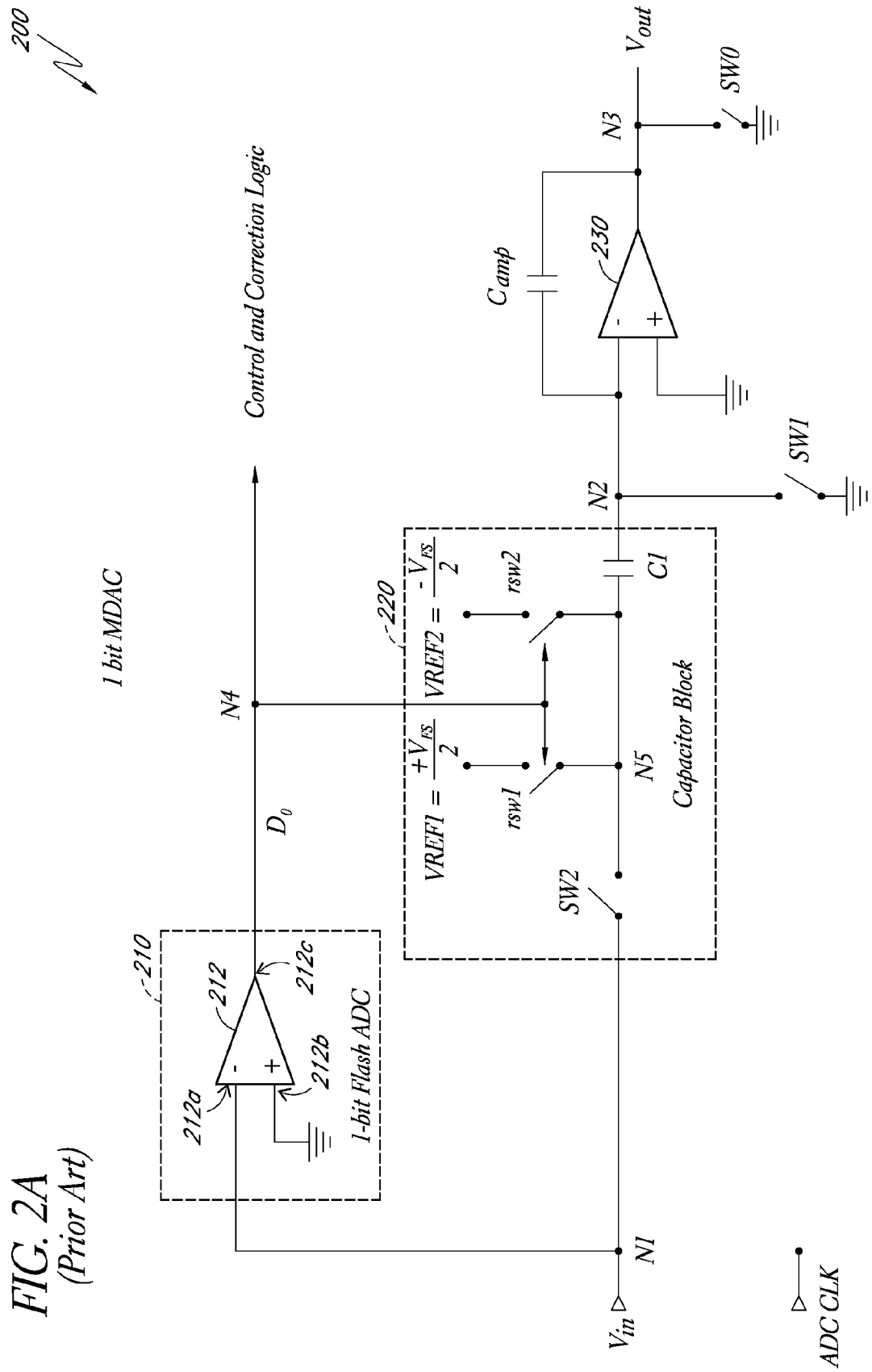
FIG. 2A is a circuit diagram of a 1-bit multiplying digital-to-analog converter (MDAC) for one of the stages of the pipelined analog-to-digital converter of FIG. 1A.
Figure 2B:
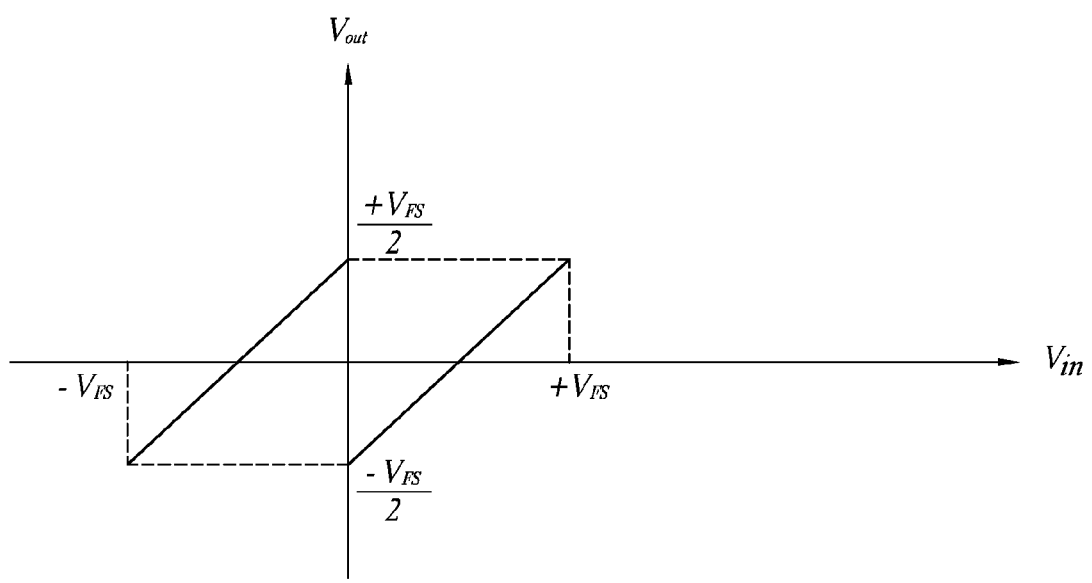
FIG. 2B is a graph illustrating the relationship between the input and output of the MDAC of FIG. 2A.
Figure 4:
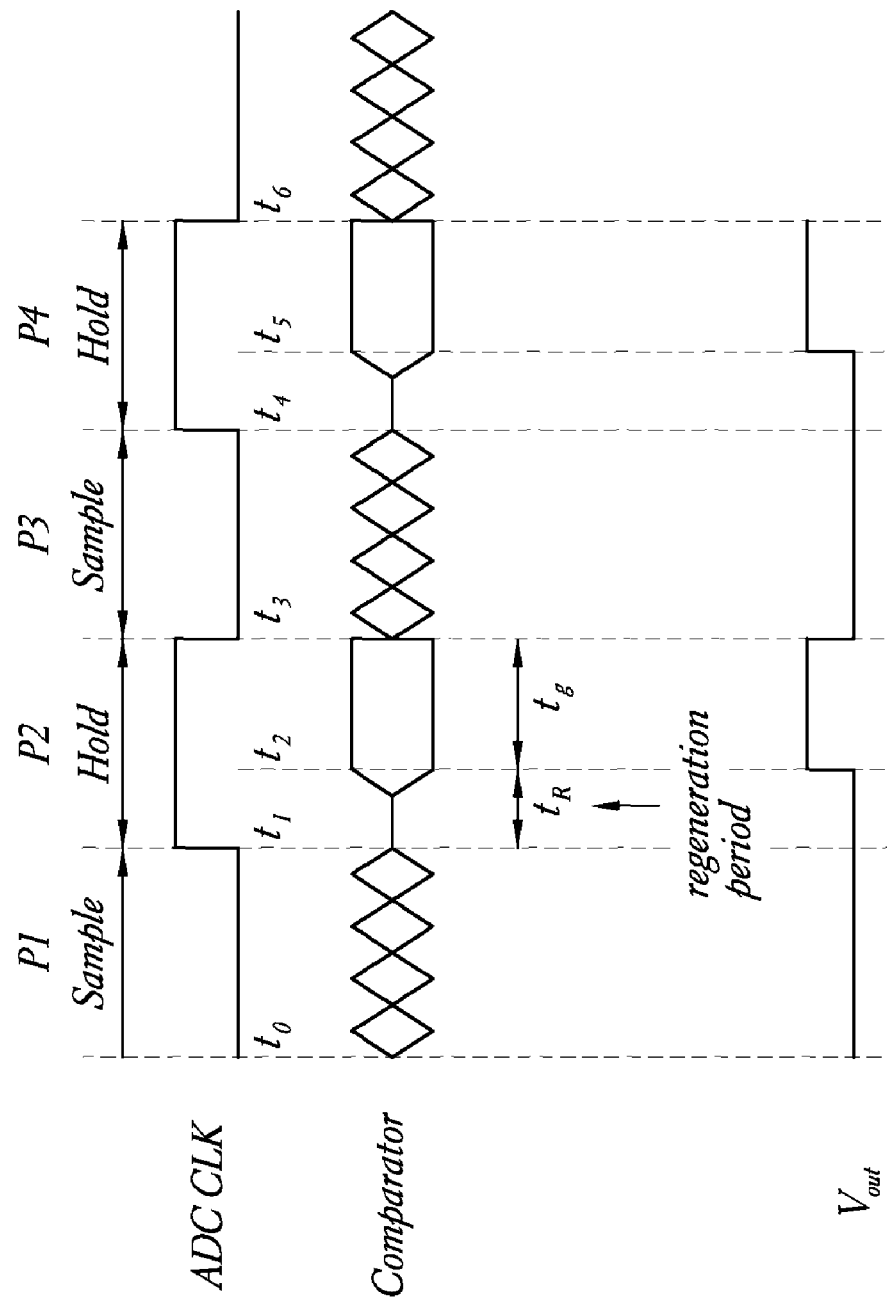
FIG. 4 is a timing diagram illustrating the operation of the MDAC of FIG. 2A.

Referring to FIG. 4 which illustrates the operation of the 1-bit MDAC stage 200 of FIG. 2A, during a first period P1 between t0 and t1 (which may be referred to as a "sample period"), the ADC clock signal ADC CLK, is low, and the comparator 212 is tracking the input signal Vin. During this tracking mode, the comparator 212 is provided with a clock signal CLK that is high. The output switch SW0 and the first and second switches SW1, SW2 are on, and the first and second reference switches rsw1 and rsw2 are off. At t1, the ADC clock signal ADC CLK goes high, triggering a hold period. However, a gain time period tg starts at t2 after a regeneration time period $t_R$, as shown in FIG. 4. The regeneration time period $t_R$ may be shortened to a certain extent by various schemes, but cannot be eliminated. In some pipelined ADCs that use a high frequency clock, a clock cycle is relatively short. Thus, the regeneration time period may significantly reduce the gain time period, thereby adversely affecting the operation of the ADCs. Thus, there is a need for an MDAC configuration that can avoid such a problem.

MDAC Stage of a Pipelined ADC with Alternating Flash ADC Outputs

In some embodiments, an MDAC stage of a pipelined ADC includes two or more flash ADCs connected in parallel, alternately generating digital signals from an analog input voltage. In such embodiments, the alternately operating flash ADCs provide the digital signals to a capacitor block that receives a delayed analog input voltage. This configuration allows the flash ADCs to have relatively more regeneration time while increasing MDAC gain time which is defined as the time when the charge from one or more input capacitors in the capacitor block is subtracted from a respective one of reference voltages (for example, either VREF1 or VREF2 shown in FIG. 2A) and transferred to an amplifier capacitor. Preferably, each of the MDAC stages of a pipelined ADC is configured with alternating Flash ADCs.

In another embodiment, an MDAC stage of a pipelined ADC includes two or more flash ADCs connected in parallel, alternately generating digital signals from an analog input voltage. The MDAC may also include two or more capacitor blocks, each of which is associated with a respective one of the flash ADCs, forming two or more sets of a flash ADC and a capacitor block. The two or more sets of a flash ADC and a capacitor block alternately operate while allowing each set to have a sufficient regeneration time without reducing gain time. The operations of the two or more sets of the flash ADC and the capacitor block can be controlled by a timing controller which can be part of a control and correction logic of the pipelined ADC.

In yet another embodiment, an MDAC stage of a pipelined ADC includes two or more flash ADCs connected in parallel, alternately generating digital signals from an analog input voltage. The MDAC stage may also include three or more capacitor blocks, each of which is randomly selected at a time for operating with one of the flash ADCs. This configuration avoids errors in the output voltage signal of the MDAC stage by averaging out differences between the capacitor blocks.

In yet another embodiment, an MDAC stage of a pipelined ADC includes a single multiple latch flash ADC that can alternately generate digital output signals in response to an analog input voltage. Such a single multiple latch flash ADC can substitute two or more flash ADCs in the embodiments described above. Referring now to FIGS. 5A-12, MDAC stages according to certain embodiments will be described below.

1-Bit MDAC Stage of a Pipelined ADC with Alternating Flash ADCs

Figure 5A:
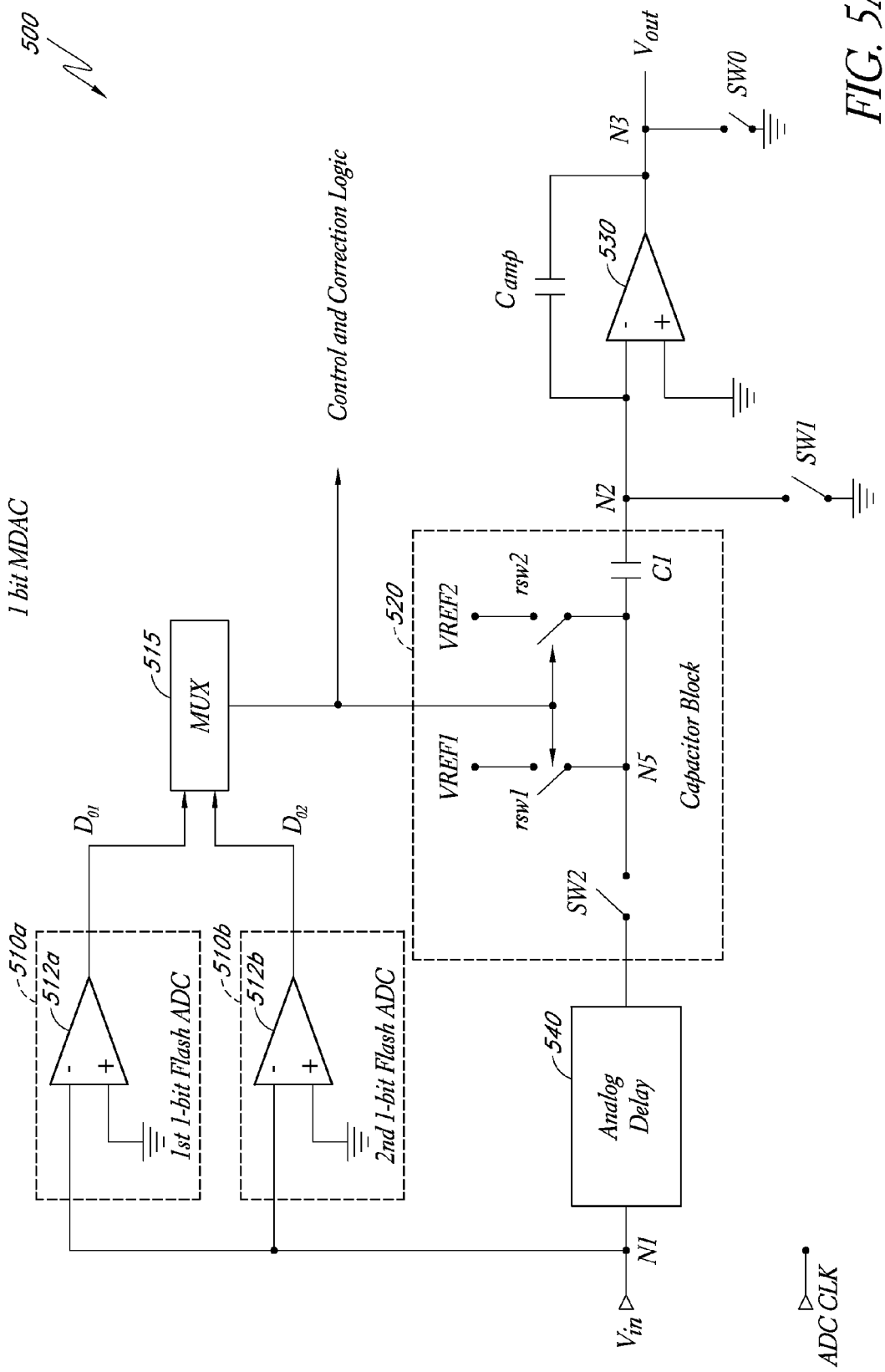
FIG. 5A is a schematic block diagram of a 1-bit MDAC according to one embodiment.

Referring to FIG. 5A, an MDAC stage of a pipelined ADC according to one embodiment will be described below. For clarity, the MDAC stage will be described with a 1-bit ADC, shown as comparators 512a, 512b. In practical embodiments, multiple-bit ADCs are applicable, such as N-bit ADC with a bank of, for example, $2^N-1$ comparators. An example of a value for N is 3, but other values will be readily determined by one of ordinary skilled in the art. Such a configuration will be described later in connection with FIGS. 6A-6C. The illustrated MDAC stage 500 is a 1-bit MDAC which includes a first 1-bit flash ADC 510a, a second 1-bit flash ADC 510b, a multiplexer 515, a capacitor block 520, an amplifier 530, an amplifier capacitor Camp, an analog delay 540, a first switch SW1, an output switch SW0, first to third nodes N1-N3, and a fifth node N5. Details of the amplifier 530, the amplifier capacitor Camp, the first switch SW1, the output switch SW0 can be as described above with respect to those of the amplifier 230, the amplifier capacitor Camp, the first switch SW1, the output switch SW0 of FIG. 2A.

Each of the 1-bit flash ADCs 510a, 510b serves to quantize an input analog voltage Vin (or a residue analog voltage from an immediately preceding stage) to one bit. Of course, when multiple bit flash ADCs are used, the input to an MDAC stage is quantized to multiple bits. Details of such a configuration will be described later in connection with FIG. 6B. Each of the flash ADCs 510a, 510b includes a respective one of first and second comparators 512a, 512b. Each of the first and second comparators 512a, 512b includes a non-inverting input, an inverting input, and an output. The non-inverting input is coupled to the first node N1 configured to receive the input analog voltage Vin. The inverting input is coupled to ground. The output is coupled to one of inputs of the multiplexer 515, and is configured to output a respective one of first and second digital output signals Do1 or Do2.

The multiplexer 515 receives the first and second digital output signals Do1, Do2, and selectively outputs one of the signals Do1, Do2 in response to a control signal and/or an ADC clock signal ADC CLK. The multiplexer 515 provides the selected one of the signals Do1, Do2 to the capacitor block 520 and a control and correction logic (not shown). Operation of the multiplexer 515 will be described later in connection with FIG. 5B.

The capacitor block 520 includes a second switch SW2, a first reference switch rsw1, a second reference switch rsw2, and a capacitor C1. The second switch SW2 is coupled between the analog delay 540 and the fifth node N5. The first and second reference switches rsw1, rsw2 switch on or off at least partly in response to the selected one of the signals Do1, Do2. In some embodiments, the capacitor block 520 can include three or more reference voltages, and a corresponding number of reference switches that are controlled by signals from the multiplexer 515. One example of such embodiments will be described later in connection with FIG. 6A. Other details of the capacitor block 520 can be as described above with respect to the capacitor block 220 of FIG. 2A. A skilled artisan will appreciate that various other configurations of capacitor blocks can also be used for the capacitor block 520. A skilled artisan will also appreciate that, in other embodiments, a capacitor may be used as a part of the capacitor block 520 during a sample period, and may be used as an amplifier capacitor during a hold period. Operation of the capacitor block 520 will be described later in connection with FIG. 5B.

The analog delay 540 is coupled between the first node N1 and the second switch SW2. The analog delay 540 serves to delay the input voltage Vin by a selected period of time. In one embodiment, the analog delay 540 may include one or more sample-and-hold amplifiers (SHAs) connected in cascade. Each of the sample-and-hold amplifiers can delay the input voltage Vin by one half of a clock cycle, for example, an analog-to-digital converter (ADC) clock signal ADC CLK. In an alternative embodiment, the analog delay 540 may include a delay line having a length inversely proportional to the rate of the clock signal ADC CLK.

Figure 5B:
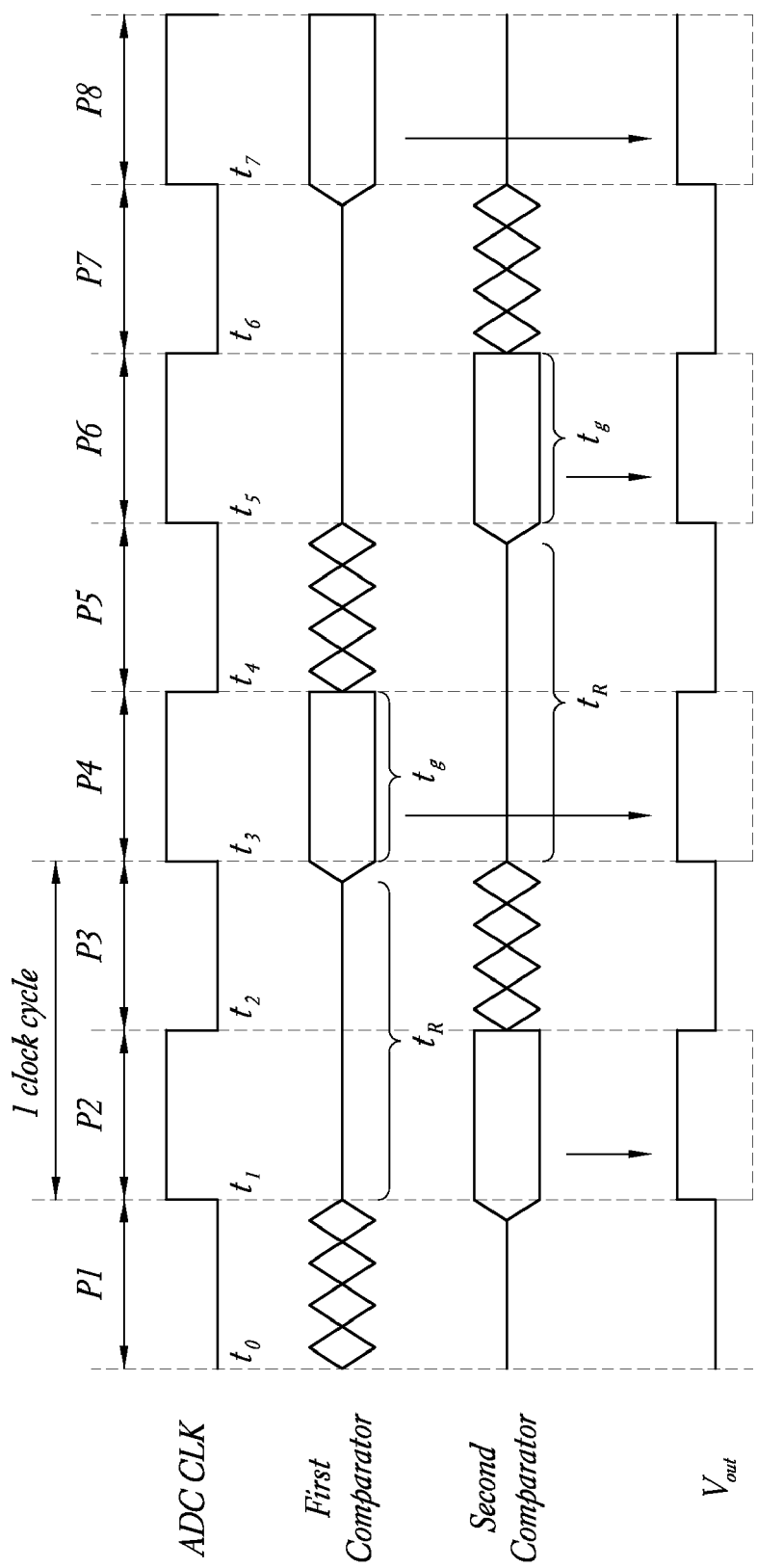
FIG. 5B is a timing diagram illustrating the operation of the MDAC of FIG. 5A.

Referring to FIG. 5B, the operation of the MDAC stage 500 of FIG. 5A will be described below. During a first time period P1 (between t0 and t1), the ADC clock signal ADC CLK is low, and the first comparator 512a tracks the input voltage Vin, and compares it to a reference voltage, ground in this example.

At t1, the ADC clock signal ADC CLK goes high. The first comparator 512a goes into a latch phase, and is allowed to have a regeneration period $t_R$ that starts at t1, and ends shortly before t3. This period insures that the latch of the first comparator 512a has come out of meta-stability, and its outputs have reached a valid logic state. Shortly before t3, a gain period tg of the first comparator 512a starts, and may last substantially the entire fourth period P4. This is the period where the delayed input signal Vin is subtracted from the first or second reference voltage VREF1 or VREF2, depending on the output of the latch of the first comparator 512a, and that charge is transferred to the amplifier capacitor Camp.

The input voltage Vin is delayed by 1 clock cycle by the analog delay 540. Thus, if the input voltage Vin reaches the first node N1 during the first period P1, it can arrive at the capacitor block 520 during the third period P3. During the third period P3, the input voltage Vin that reached the first node N1 during the first period P1 is sampled across the capacitor C1 by switching on the first and second switches SW1, SW2, and the output switch SW0, and turning off the reference switches rsw1, rsw2.

During the fourth period P4 (during which the MDAC 500 stage can be in a hold phase), the multiplexer 515 selects the first digital output signal Do1 from the first comparator 512a, and provides the signal Do1 to the capacitor block 520. At the same time, the first and second switches SW1, SW2, and the output switches SW0 are switched off, and an appropriate reference voltage, either VREF1 or VREF2, is applied to the capacitor C1 through either of the first and second switches rsw1, rsw2, depending on the first digital output signal Do1. The difference charge (the input voltage Vin minus a selected reference voltage VREF1 or VREF2) across the capacitor C1 is transferred to the amplifier capacitor Camp to generate the output voltage Vout by the negative feedback of the amplifier 530. During a fifth period P5 (between t4 and t5) SW1, SW2, and the output switch SW0 are turned on to reset the capacitor block 520 and the amplifier 530.

During the third time period P3, the second comparator 512b tracks the input voltage Vin and compares it to a reference voltage, ground in this example. At t3, the second comparator 512b goes into a latch phase, and is allowed to have a regeneration period $t_R$ that starts at t3, and ends shortly before t5. This period insures that the latch of the second comparator 512b has come out of meta-stability and its outputs have reached a valid logic state. Shortly before t5, a gain period tg of the second comparator 512b starts, and may last substantially the entire sixth period P6. This is the period where the delayed input signal Vin is subtracted from either the first or second reference voltage VREF1 or VREF2, depending on the output of the latch of the second comparator 512b, and that charge is transferred to the amplifier capacitor Camp.

As described above, the input voltage Vin is delayed by 1 clock cycle by the analog delay 540. Thus, if the input voltage Vin reaches the first node N1 during the third period P3, it can arrive at the capacitor block 520 during the fifth period P5. During the fifth period P5, the input voltage Vin that reached the first node N1 during the third period P3 is sampled across the capacitor C1 by switching on the first and second switches SW1, SW2, and the output switch SW0, and turning off the reference switches rsw1, rsw2.

During the sixth period P6 (during which the MDAC 500 stage can be in a hold phase), the multiplexer 515 selects the second digital output signal Do2 from the second comparator 512b, and provides the signal Do2 to the capacitor block 520. At the same time, the first and second switches SW1, SW2, and the output switch SW0 are switched off, and an appropriate reference voltage, either the first or second reference voltage VREF1 or VREF2, is applied to the capacitor C1 through either of the first and second switches rsw1, rsw2, depending on the second digital output signal Do2. The difference charge (the input voltage Vin minus a selected reference voltage VREF1 or VREF2) across the capacitor C1 is transferred to the amplifier capacitor Camp to generate the output voltage Vout by the negative feedback of the amplifier 530. During a seventh period P7 (between t6 and t7), the first and second switches SW1, SW2, and the output switch SW0 are turned on to reset the capacitor block 520 and the amplifier 530.

As described above, the regeneration periods $t_R$ of the first and second comparators 512a, 512b end before the hold phases of the MDAC stage operation start. Thus, the gain periods tg of the comparators 512a, 512b can last from the start to the end of each of the hold phases. For example, the gain period tg can be substantially equal to or greater than half a cycle of the clock signal ADC CLK. Thus, even in high frequency operations, the regeneration periods do not shorten the gain periods.

N-Bit MDAC Stage of a Pipelined ADC with Alternating Flash ADCs

Figure 6A:
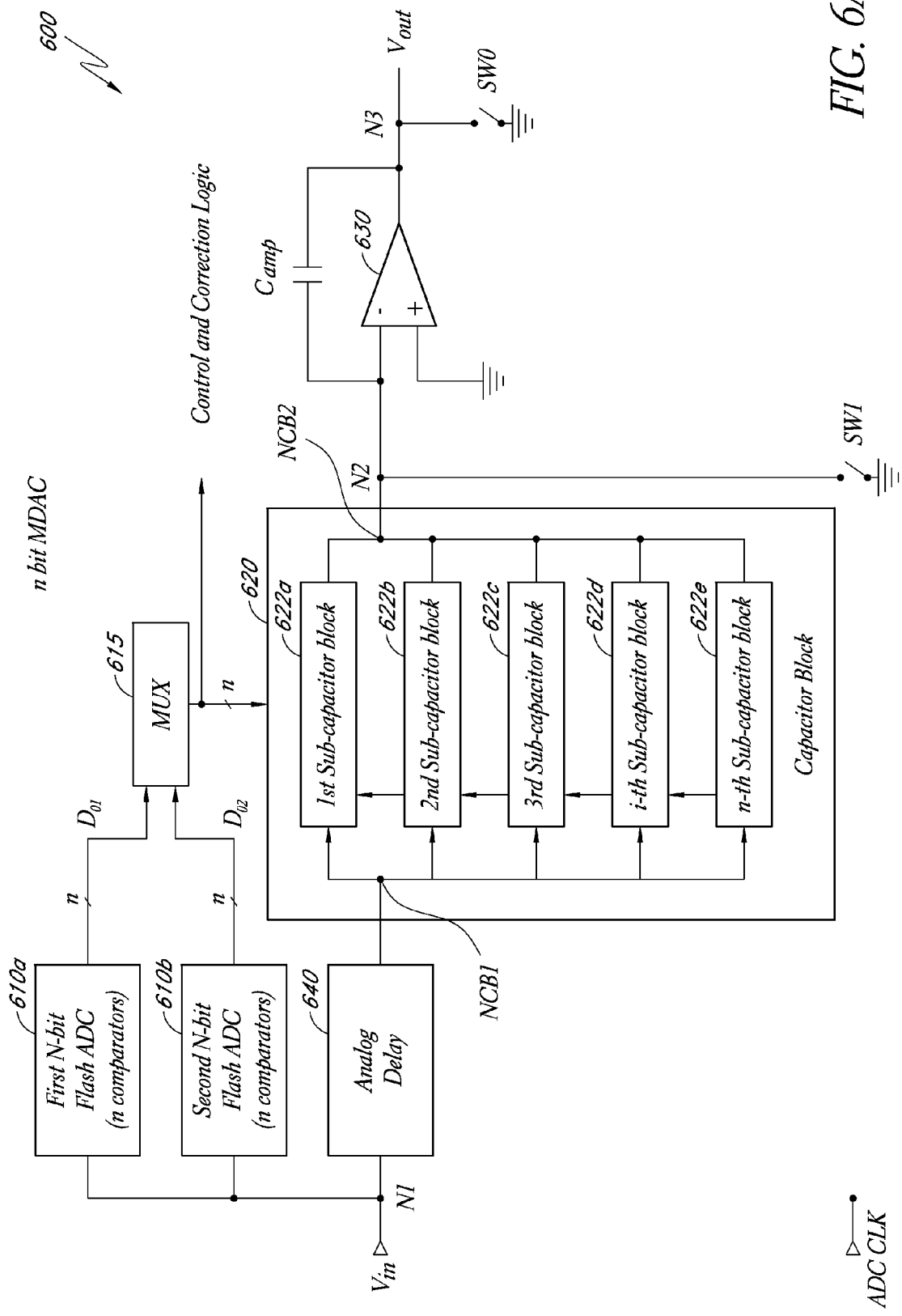
FIG. 6A is a schematic block diagram of an N-bit MDAC according to one embodiment.
Figure 6B:
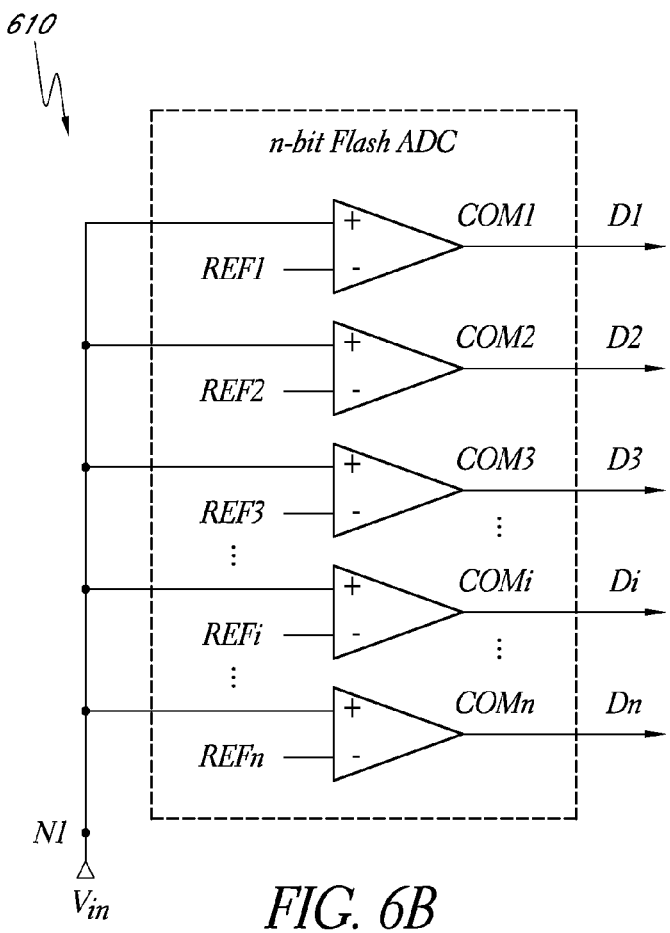
FIG. 6B is a schematic diagram of an N-bit flash ADC of the MDAC of FIG. 6A according to one embodiment.
Figure 6C:
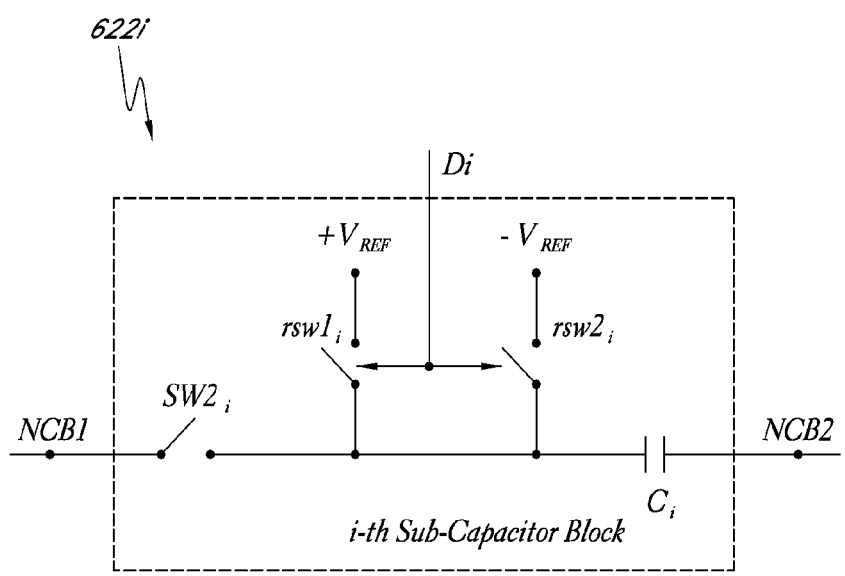
FIG. 6C is a schematic diagram of a sub-capacitor block of the MDAC of FIG. 6A according to one embodiment.

Referring to FIGS. 6A-6C, an MDAC stage according to another embodiment will be described below. The illustrated MDAC stage 600 is an N-bit MDAC stage which includes a first N-bit flash ADC 610a, a second N-bit flash ADC 610b, a multiplexer 615, a capacitor block 620, an amplifier 630, an amplifier capacitor Camp, an analog delay 640, a first switch SW1, an output switch SW0, and first to third nodes N1-N3. Details of the amplifier 630, the amplifier capacitor Camp, the first switch SW1, the output switch SW0 can be as described above with respect to those of the amplifier 230, the amplifier capacitor Camp, the first switch SW1, the output switch SW0 of FIG. 2A.

Each of the N-bit flash ADCs 610a, 610b serves to quantize an input analog voltage Vin (or a residue analog voltage from an immediately preceding stage) to N bits. N may be 1.5, or an integer equal to or greater than 2. Each of the flash ADCs 610a, 610b may includes n number of comparators. n may be $2^N$, $2^N-1$, or $2^N-2$, depending on the design of the ADCs.

FIG. 6B illustrates one embodiment of an N-bit flash ADC. Each of the flash ADCs 610a, 610b of FIG. 6A can have the configuration shown in FIG. 6B. The illustrated flash ADC 610 includes first to n-th comparators CM1-CMn. Each of the first to n-th comparators COM1-COMn includes a non-inverting input, an inverting input, and an output. The non-inverting input is coupled to the first node N1 configured to receive the input analog voltage Vin. The inverting input is coupled to a respective one of reference voltages, REF1-REFn, which are typically generated from a resistor ladder. In some embodiments, the first and second flash ADCs 610a, 610b can share the same reference voltages REF1-REFn. The output is coupled to an input of the multiplexer 615, and is configured to output a digital signal D1, D2, D3, ..., Di, ..., or Dn that forms part of one of first and second digital output signal sets Do1 or Do2. In other words, each of the first and second digital output signal sets Do1 or Do2 includes n-number of signals from the comparators COM1-COMn of one of the flash ADCs 610a, 610b.

The multiplexer 615 receives the first and second digital output signal sets Do1, Do2, and selectively outputs one of the signal sets Do1, Do2 in response to a control signal and/or an ADC clock signal ADC CLK. The multiplexer 615 provides the selected one of the signal sets Do1, Do2 to the capacitor block 620 and a control and correction logic (not shown).

Figure 1B:
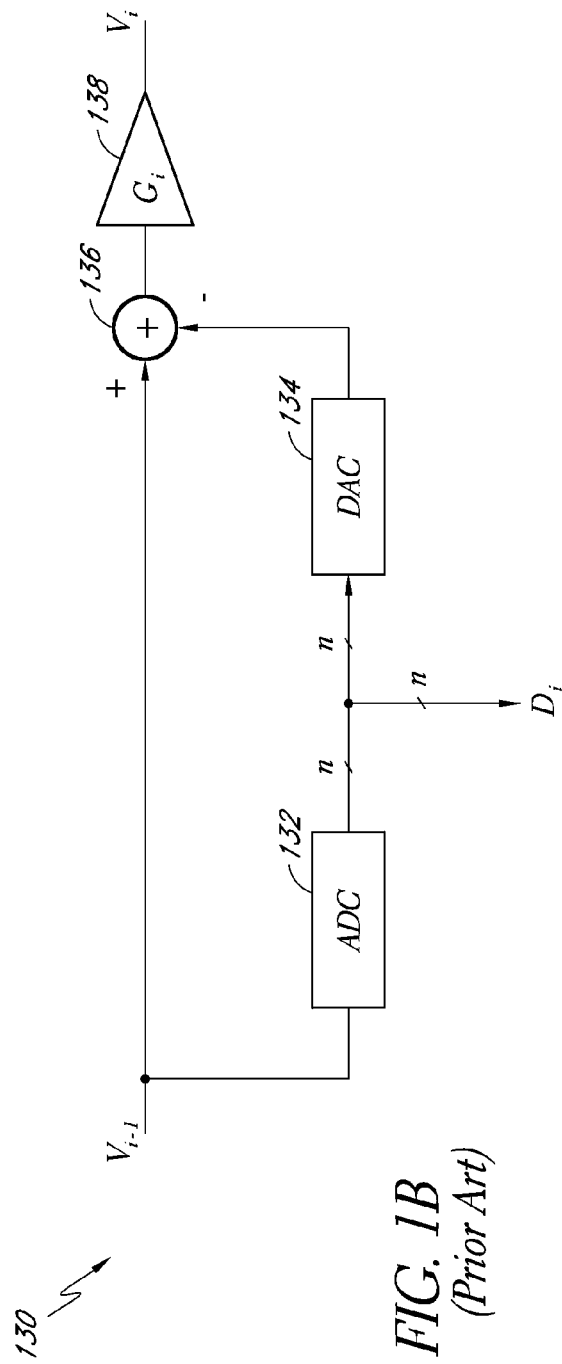
FIG. 1B is a schematic block diagram illustrating one of the stages of the pipelined analog-to-digital converter of FIG. 1A.

The capacitor block 620 includes first to n-th sub-capacitor blocks 622a-622e. Each of the sub-capacitor blocks 622a-622e includes an input coupled to the analog delay 640 via a first capacitor block node NCB1, and an output coupled to the second node N2 via a second capacitor block node NCB2. The sub-capacitor blocks 622a-622e are collectively configured to convert a digital signal represented by either the first or second signal sets Do1, Do2 into an analog voltage, and subtract the converted analog voltage from the input analog voltage Vin, serving as an DAC and a summation block (see FIG. 1B). Each of the sub-capacitor block 622a-622e is configured to sample and hold the input voltage Vin, and subtract a selected reference voltage from the input voltage Vin in response to a respective one signal of the first or second signal sets Do1, Do2, thereby providing an analog output voltage.

Referring to FIG. 6C, one embodiment of a sub-capacitor block 622 will be described below. Each of the sub-capacitor blocks 622a-622e of FIG. 6A may have the configuration shown in FIG. 6C. The sub-capacitor block 622 includes a second switch SW2$i$, a first reference switch rsw1$i$, a second reference switch rsw2$i$, and a capacitor Ci. The second switch SW2$i$ is coupled to the first capacitor block node NCB1. The capacitor Ci is coupled between the second switch SW2$i$ and the second capacitor block node NCB2. The first and second reference switches rsw1$i$, rsw2$i$ switch on or off at least partly in response to a respective one signal $D_i$ of the selected one of the digital output signal sets Do1, Do2. Other details of the sub-capacitor block 622 can be as described above with respect to the capacitor block 520 of FIG. 5A.

The analog delay 640 is coupled between the first node N1 and the first capacitor block node NCB1. The analog delay 640 serves to delay the input voltage Vin by a selected period of time. Other details of the analog delay 640 can be as described above with respect to the analog delay 540 of FIG. 5A.

The operation of the N-bit MDAC 600 can be substantially the same as the operation of the 1-bit MDAC 500 of FIG. 5A, except that each of the N-bit flash ADCs 610a, 610b generates an N-bit signal, instead of a 1-bit signal, and the sub-capacitor blocks 622a-622e operate together to function as a capacitor block like the capacitor block 520 of FIG. 5A. Thus, a skilled artisan will readily appreciate that the timing diagram of FIG. 5B can apply to the operation of the N-bit MDAC 600.

MDAC Stage of a Pipelined ADC with Alternating Flash ADCs and Timing Controller

Figure 7A:
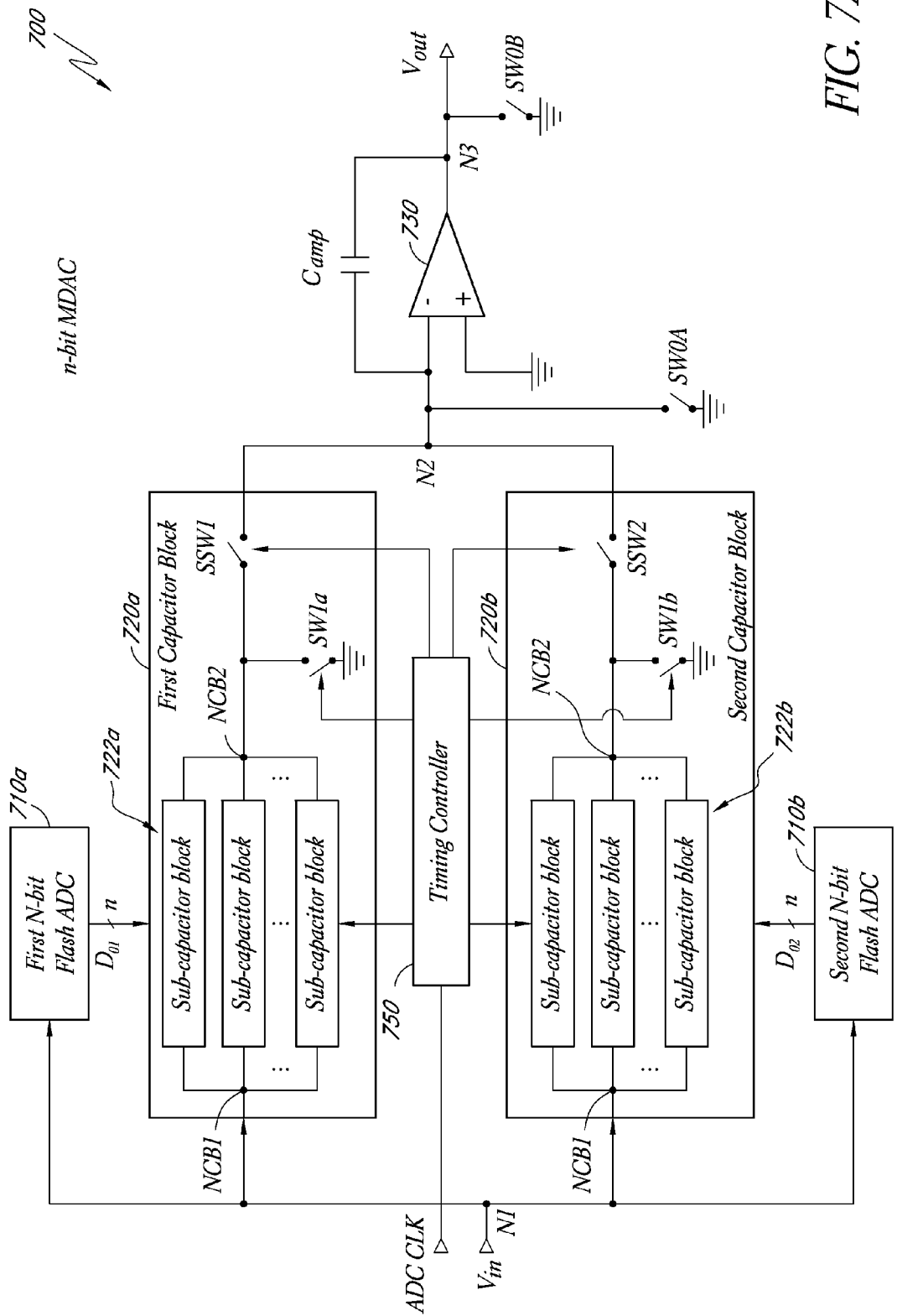
FIG. 7A is a schematic block diagram of an N-bit MDAC including multiple capacitor blocks according to another embodiment.

Referring to FIG. 7A, an MDAC stage according to another embodiment will be described below. The illustrated MDAC 700 is an N-bit MDAC which includes a first N-bit flash ADC 710a, a second N-bit flash ADC 710b, a first capacitor block 720a, a second capacitor block 720b, an amplifier 730, an amplifier capacitor Camp, a timing controller 750, a first output switch SW0A, a second output switch SW0B, and first to third nodes N1-N3. Details of the amplifier 730, the amplifier capacitor Camp, the second output switch SW0B can be as described above with respect to those of the amplifier 230, the amplifier capacitor Camp, the output switch SW0, respectively, of FIG. 2A.

Each of the N-bit flash ADCs 710a, 710b serves to quantize an input analog voltage Vin (or a residue analog voltage from an immediately preceding stage) to N bits. The first and second N-bit flash ADCs 710a, 710b outputs first and second digital output signal sets Do1, Do2, respectively. Other details of the N-bit flash ADCs 710a, 710b can be as described earlier in connection with FIG. 6B.

The first capacitor block 720a includes first to n-th sub-capacitor blocks 722a. Each of the sub-capacitor blocks 722a includes an input coupled to a first capacitor block node NCB1 coupled to the first node N1, and an output coupled to a second capacitor block node NCB2. Details of each of the sub-capacitor blocks 722a can be as described earlier in connection with FIG. 6C.

The first capacitor block 720a also includes a first capacitor block switch SW1a and a first selection switch ssw1. The first capacitor block switch SW1a is coupled between the second capacitor block node NCB2 and ground. The first selection switch ssw1 is coupled between the second capacitor block node NCB2 and the second node N2. The second node N2 can be coupled to ground via the first output switch SW0A when the first output switch SW0A is turned on.

The second capacitor block 720b includes first to n-th sub-capacitor blocks 722b. Each of the sub-capacitor blocks 722b includes an input coupled to a first capacitor block node NCB1 coupled to the first node N1, and an output coupled to a second capacitor block node NCB2. Details of each of the sub-capacitor blocks 722b can be as described earlier in connection with FIG. 6C.

The second capacitor block 720b also includes a second capacitor block switch SW1b and a second selection switch ssw2. The second capacitor block switch SW1b is coupled between the second capacitor block node NCB2 and ground. The second selection switch ssw2 is coupled between the second capacitor block node NCB2 and the second node N2.

The timing controller 750 is configured to control the operations of the switches within the capacitor blocks 720a, 720b, including the first and second capacitor block switches SW1a, SW1b and the first and second selection switches ssw1, ssw2, and switches within the sub-capacitor blocks 722a, 722b. The timing controller 750 can be considered to be part of a control and correction logic. The timing controller 750 can operate in response to an analog-to-digital converter (ADC) clock signal ADC CLK, and can control the alternating operation based on alternating clock cycles, alternating clock phases, or the like of the clock signal ADC CLK.

Figure 7B:
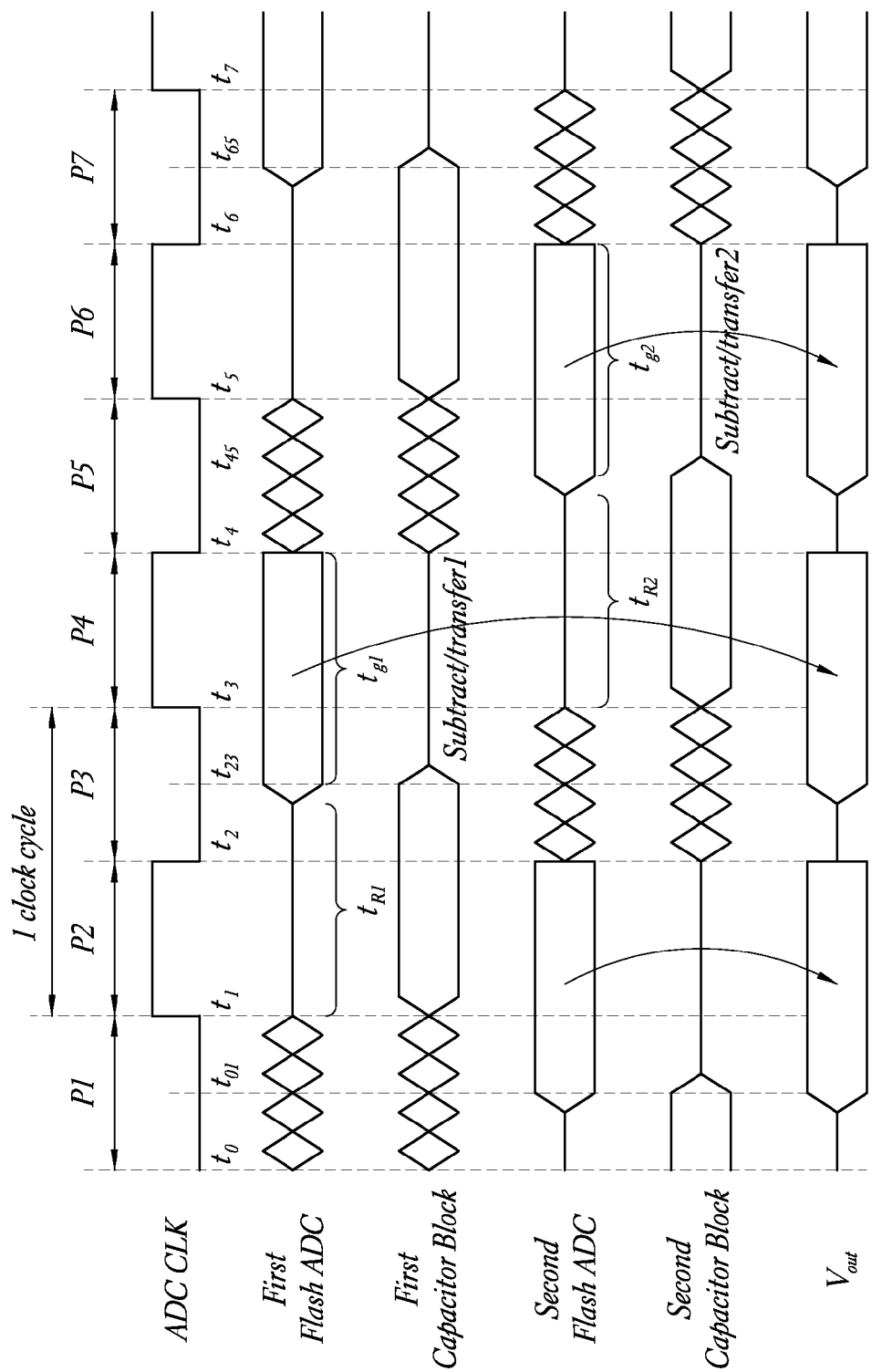
FIG. 7B is a timing diagram illustrating the operation of the MDAC of FIG. 7A.

Referring to FIG. 7B, the operation of the MDAC stage 700 of FIG. 7A will be described below. During a first time period P1 (between t0 and t1), the first flash ADC 710a tracks the input voltage Vin and compares it to reference voltages. In addition, during the first time period P1, the first capacitor block switch SW1a and the second switches (see SW2$i$ of FIG. 6C) in the sub-capacitor blocks 722a of the first capacitor block 720a are on, and the first capacitor block 720a is in sample mode. At t1, the first flash ADC 710a goes into a latch phase, and is allowed to have a regeneration period $t_{R1}$ that starts at t1 and ends at t23 before t3. This period insures that the latches of the first flash ADC 710a have come out of meta-stability and their outputs have reached a valid logic state. At t23, a gain period tg1 of the first flash ADC 710a starts, and may last substantially the entire fourth period P4 (between t3 and t4). In addition, at t1, the first capacitor block switch SW1a and the second switches in the sub-capacitor blocks 722a of the first capacitor block 720a are turned off.

During a period between t1 and t4, the input analog voltage Vin is held across the first capacitor block 720a by switching off the first capacitor block switch SW1a and the second switches in the sub-capacitor blocks 722a of the first capacitor block 720a while keeping the other switches off.

During another period between t23 and t4, the first flash ADC 710a provides the first digital signal set Do1 to the sub-capacitor blocks 722a of the first capacitor block 720a. At the same time, an appropriate reference voltage, either VREF1 or VREF2, is applied to each of the sub-capacitor blocks 722a through either of the first and second reference switches (see rsw1, rsw2 of FIG. 6C) within the sub-capacitor blocks 722a, depending on the first digital output signal set Do1.

Further, the first selection switch ssw1 is turned on at time t23 to couple the sub-capacitor block node NCB2 of the first capacitor block 720a to the second node N2. Also, the first and second output switches SW0A and SW0B are turned off at time t23. The difference charge between the input voltage Vin and a selected reference voltage VREF1 or VREF2 is transferred to the amplifier capacitor Camp due to the large negative feedback of the amplifier 730 and generates an output voltage Vout. In the context of this document, a period during which a difference charge between an input voltage and a reference voltage is transferred can be referred to as an MDAC charge transfer period.

During yet another period between t4 and t45, the first capacitor block switch SSW1 is turned off, and the first and second output switches SW0A and SW0B are turned on to remove the charge across the amplifier capacitor Camp.

During a third time period P3 (between t2 and t3), the second flash ADC 710b tracks the input voltage Vin, and compares it to reference voltages. In addition, during the third time period P3, the second capacitor block switch SW1b and the second switches (see SW2i of FIG. 6C) in the sub-capacitor blocks 722b of the second capacitor block 720b are on, and the second capacitor block 720b is in sample mode. At t3, the second flash ADC 710b goes into a latch phase, and is allowed to have a regeneration period $t_{R2}$ that starts at t3 and ends at t45 before t5. This period insures that the latches of the second flash ADC 710b have come out of meta-stability and their outputs have reached a valid logic state. At t45, a gain period tg2 of the second flash ADC 710b starts, and may last substantially the entire sixth period P6 (between t5 and t6). In addition, at t3, the second capacitor block switch SW1b and the second switches in the sub-capacitor blocks 722b of the second capacitor block 720b are turned off.

During a period between t3 and t6, the input analog voltage Vin is held across the second capacitor block 720b by switching off the second capacitor block switch SW1b and the second switches in the sub-capacitor blocks 722b of the second capacitor block 720b while keeping the other switches off.

During another period between t45 and 6, the second flash ADC 710b provides the second digital signal set Do2 to the sub-capacitor blocks 722b of the second capacitor block 720b. At the same time, an appropriate reference voltage, either VREF1 or VREF2, is applied to each of the sub-capacitor blocks 722b through either of the first and second reference switches (see rsw1, rsw2 of FIG. 6C) within the sub-capacitor blocks 722b, depending on the second digital output signal set Do2.

Further, the second selection switch SSW2 is turned on at time t45 to couple the sub-capacitor block node NCB2 of the second capacitor block 720b to the second node N2. Also, the first and second output switches SW0A and SW0B are turned off at time t45. The difference charge between the input voltage Vin and a selected reference voltage VREF1 or VREF2 is transferred to the amplifier capacitor Camp due to the large negative feedback of amplifier 730 and generates an output voltage Vout. During yet another period between t6 and t65, the second capacitor block switch SSW1 is turned off, and the first and second output switches SW0A and SW0B are turned on to remove the charge across the amplifier capacitor Camp.

In the embodiment described above, by using separate capacitor blocks, the gain periods tg1, tg2 of the flash ADCs 710a, 710b and the MDAC charge transfer period can be lengthened to be greater than half a clock cycle. For example, the gain period tg can be substantially equal to or greater than about ¾ of a cycle of the clock signal ADC CLK. Thus, the performance of the MDAC stage 700 can be maintained while operating at high frequency.

MDAC Stage of a Pipelined ADC with Random Selection of Capacitor Blocks

Referring to FIG. 8A, an MDAC stage according to yet another embodiment will be described below. The illustrated MDAC stage 800 is an N-bit MDAC stage which includes a first N-bit flash ADC 810a, a second N-bit flash ADC 810b, a multiplexer 815, a data controller 817, a first capacitor block 820a, a second capacitor block 820b, and a third capacitor block 820c, an amplifier 830, an amplifier capacitor Camp, a timing controller 850, first and second output switches SW0A, SW0B, and first to third nodes N1-N3. Details of the amplifier 830, the amplifier capacitor Camp, the output switches SW0A, SW0B can be as described above with respect to those of the amplifier 730, the amplifier capacitor Camp, the output switches SW0A, SW0B of FIG. 7A.

Each of the N-bit flash ADCs 810a, 810b serves to quantize an input analog voltage Vin (or a residue analog voltage from an immediately preceding stage) to N bits. The first and second N-bit flash ADCs 810a, 810b output first and second digital output signal sets Do1, Do2, respectively, to the multiplexer 815. Other details of the N-bit flash ADCs 810a, 810b can be as described above in connection with FIG. 6B.

The multiplexer 815 is configured to receive the first and second digital output signal sets Do1, Do2, and selectively output one of the signal sets Do1, Do2 in response to a first control signal CT1 from the timing controller 850. The multiplexer 815 provides the selected one of the signal sets Do1, Do2 to the data controller 817.

The data controller 817 is configured to receive the selected signal set Do1 or Do2 and output it to one of the first to third capacitor blocks 820a-820c, in response to a second control signal CT2 from the timing controller 850. The data controller 817 serves to randomly select one of the first to third capacitor blocks 820a-820c, and send the selected signal set Do1 or Do2 to the selected capacitor block 820a, 820b, or 820c.

In one embodiment, the data controller 817 is configured to select the capacitor blocks such that no capacitor block is selected consecutively. For example, the data controller 817 may select the capacitor blocks in the following order:
first capacitor block 820a→second capacitor block 820b→third capacitor block 820c→second capacitor block 820b→third capacitor block 820c→first capacitor block 820a.

Each of the first to third capacitor blocks 820a-820c includes first to n-th sub-capacitor blocks. Other details of the capacitor blocks 820a-820c can be as described above with respect to the capacitor blocks 720a, 720b in connection with FIG. 7A.

The timing controller 850 is configured to control the operations of the switches within the capacitor blocks 820a-820c. The timing controller 850 can operate in response to an ADC clock signal ADC CLK.

Figure 8:
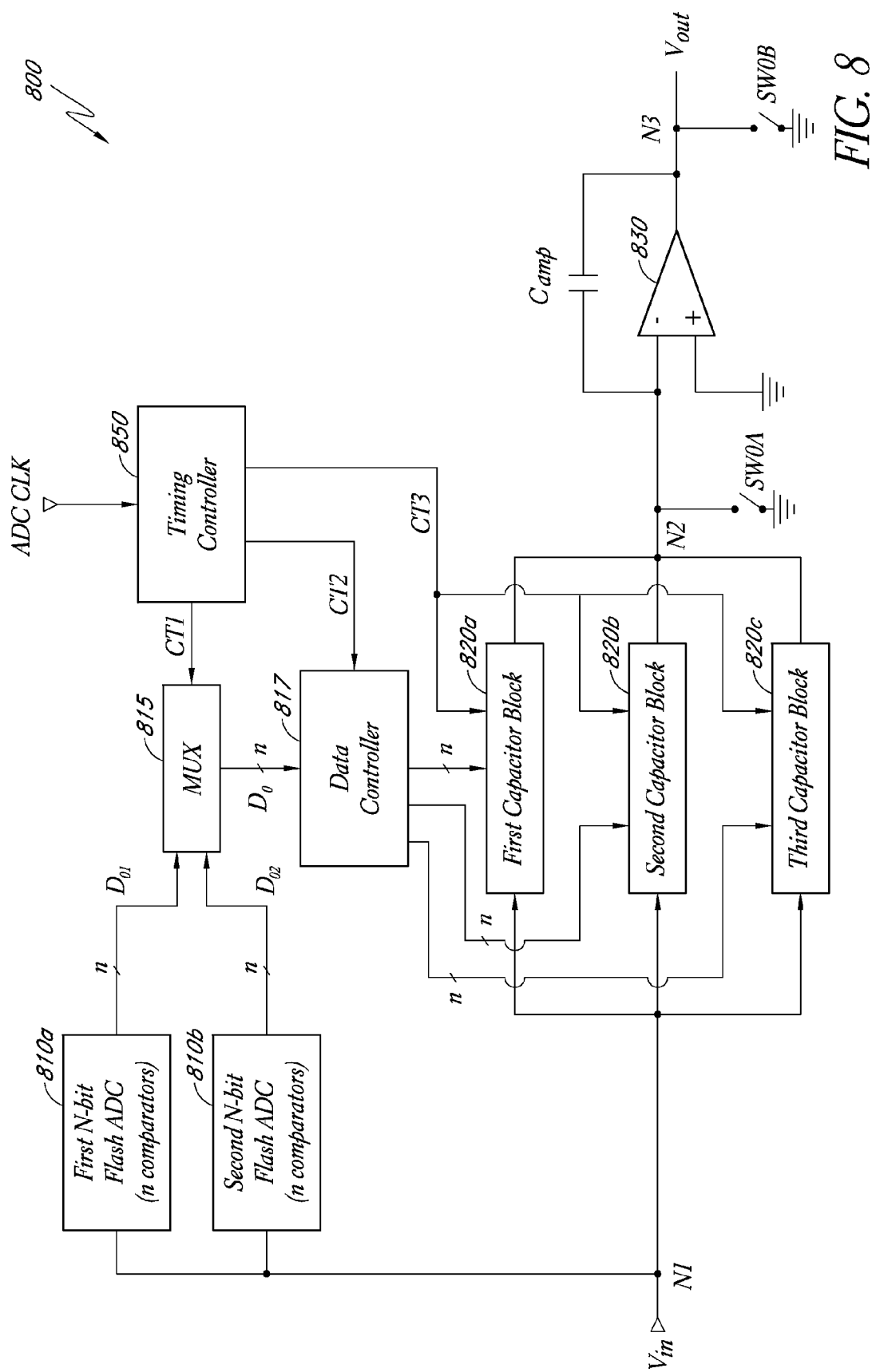
FIG. 8 is a schematic block diagram of an N-bit MDAC with random selection of capacitor blocks according to yet another embodiment.

During the operation, the MDAC stage 800 may operate in the same manner as that of the MDAC stage 700 of FIG. 7A, as shown in FIG. 7B, except for the randomized use of the capacitor blocks 820a-820c. In the MDAC stage of FIG. 7A, each of the flash ADC 710a, 710b has a capacitor block 720a, 720b associated with it, and cannot use the other capacitor block. In the embodiment of FIG. 8, the flash ADCs 710a, 710b are not associated with a particular capacitor block, but can operate with any capacitor block other than the block used in the previous cycle.

In the MDAC stage of FIG. 7A, if there is a difference in capacitance between the first and second capacitor blocks 720a, 720b, the resulting output voltage Vout will have a spurious error of frequency, due to the difference. For example, the spurious error of frequency can be represented by the formula below.

$$f(\text{analog signal}) +/- f(\text{sample frequency})/2$$

In the formula, "f(signal)" represents the frequency of the analog input signal, and "f(sample frequency)" represents the frequency of the sample clock. The scheme described above in connection with FIG. 8 can avoid such a problem by randomly averaging out differences, if any, between the capacitor blocks.

Figure 9:
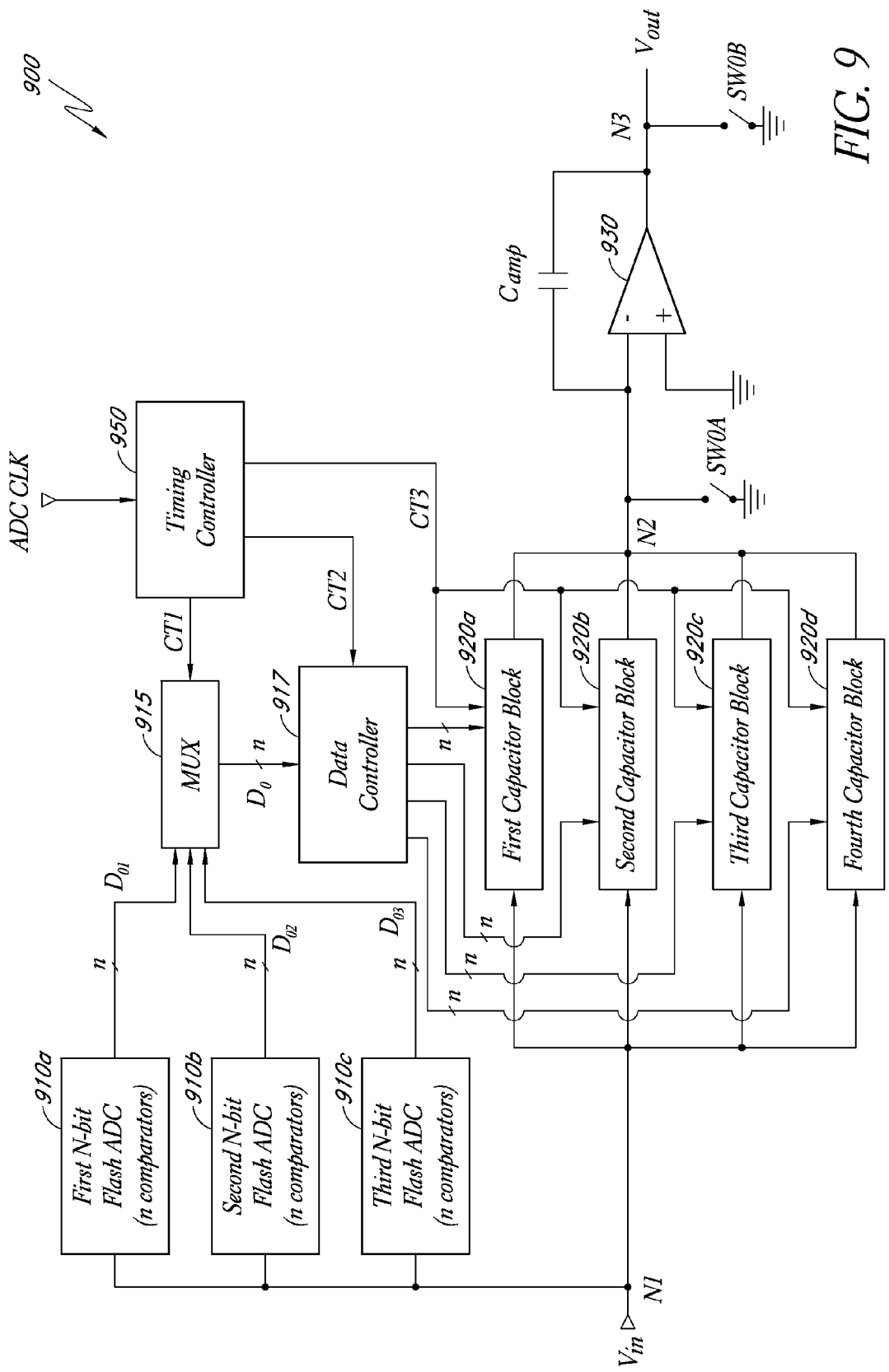
FIG. 9 is a schematic block diagram of an N-bit MDAC with random selection of capacitor blocks according to yet another embodiment.

Referring to FIG. 9, an MDAC stage according to yet another embodiment will be described below. The illustrated MDAC stage 900 is an N-bit MDAC stage which includes a first N-bit flash ADC 910a, a second N-bit flash ADC 910b, a third N-bit flash ADC 910c, a multiplexer 915, a data controller 917, a first capacitor block 920a, a second capacitor block 920b, a third capacitor block 920c, a fourth capacitor block 920d, an amplifier 930, an amplifier capacitor Camp, a timing controller 950, first and second output switches SW0A, SW0B, and first to third nodes N1-N3. Details of the amplifier 930, the amplifier capacitor Camp, the output switches SW0A, SW0B can be as described above with respect to those of the amplifier 730, the amplifier capacitor Camp, the output switches SW0A, SW0B of FIG. 7A.

Each of the N-bit flash ADCs 910a-910c serves to quantize an input analog voltage Vin (or a residue analog voltage from an immediately preceding stage) to N bits. The first to third N-bit flash ADCs 910a-910c output first to third digital output signal sets Do1-Do3, respectively, to the multiplexer 915. Other details of each of the N-bit flash ADCs 910a-910c can be as described above in connection with FIG. 6B.

The multiplexer 915 is configured to receive the first to third digital output signal sets Do1-Do3, and selectively output one of the signal sets Do1-Do3 in response to a first control signal CT1 from the timing controller 950. The multiplexer 915 provides the selected one of the signal sets Do1-Do3 to the data controller 917.

The data controller 917 is configured to receive the selected signal set Do1, Do2, or Do3 and output it to one of the first to fourth capacitor blocks 920a-920d, in response to a second control signal CT2 from the timing controller 950. The data controller 917 serves to randomly select one of the first to fourth capacitor blocks 920a-920d, and send the selected signal set Do1, Do2, or Do3 to the selected capacitor block 920a, 920b, 920c, or 920d. As in the embodiment shown in FIG. 8, the data controller 917 is configured to randomly select the capacitor blocks without selecting the same capacitor block consecutively.

Each of the first to fourth capacitor blocks 920a-920d includes first to n-th sub-capacitor blocks. Other details of the capacitor blocks 920a-920d can be as described above with respect to the capacitor blocks 820a-820c in connection with FIG. 8.

The timing controller 950 is configured to control the operations of the switches within the capacitor blocks 920a-920d, the multiplexer 915, and the data controller 917. Other details of the timing controller 950 can be as described above with respect to the timing controller 850 in connection with FIG. 8.

During the operation, the MDAC stage 900 may operate in the same manner as that of the MDAC stage 800 of FIG. 8, except that the first to third flash ADCs 910a-910c alternately provide the signal sets Do1-Do3 in sequence, and that four capacitor blocks, instead of three capacitor blocks, are provided for the randomized use of the capacitor blocks. The scheme described above in connection with FIG. 9 can further reduce errors due to a difference between the capacitor blocks.

Figure 10A:
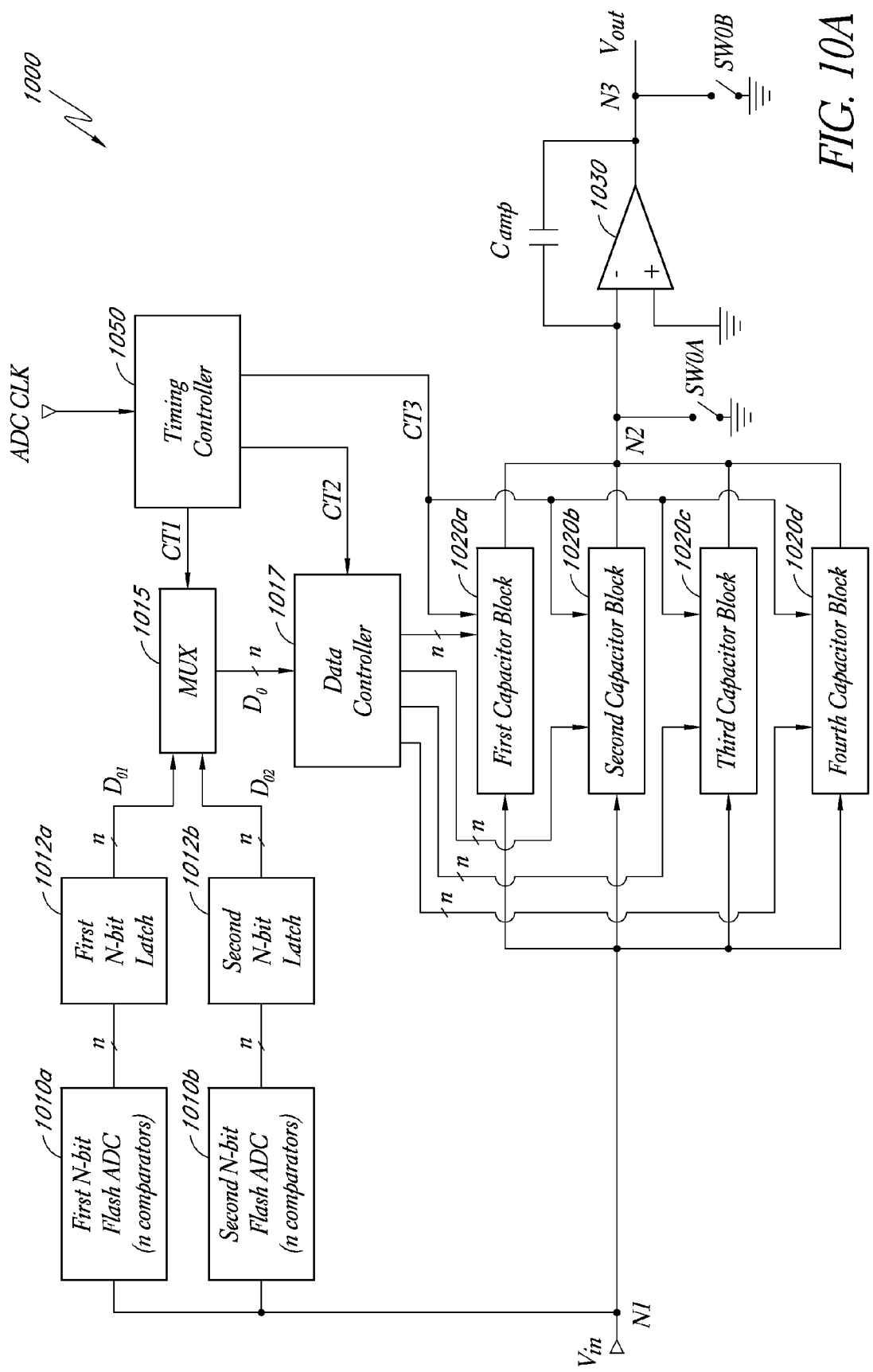
FIG. 10A is a schematic block diagram of an N-bit MDAC with random selection of capacitor blocks according to yet another embodiment.

Referring to FIG. 10A, an MDAC stage according to yet another embodiment will be described below. The illustrated MDAC stage 1000 is an N-bit MDAC stage which includes a first N-bit flash ADC 1010a, a second N-bit flash ADC 1010b, a first N-bit latch 1012a, a second N-bit latch 1012b, a multiplexer 1015, a data controller 1017, a first capacitor block 1020a, a second capacitor block 1020b, a third capacitor block 1020c, a fourth capacitor block 1020d, an amplifier 1030, an amplifier capacitor Camp, a timing controller 1050, first and second output switches SW0A, SW0B, and first to third nodes N1-N3. Details of the amplifier 1030, the amplifier capacitor Camp, the output switches SW0A, SW0B can be as described above with respect to those of the amplifier 730, the amplifier capacitor Camp, the output switches SW0A, SW0B of FIG. 7A. Details of the capacitor blocks 1020a-1020d, and the timing controller 1050 can be as described above with respect to the capacitor blocks 920a-920d, and the timing controller 950 of the MDAC stage 900 of FIG. 9.

Each of the N-bit flash ADCs 1010a, 1010b serves to quantize an input analog voltage Vin (or a residue analog voltage from an immediately preceding stage) to N bits. The first N-bit flash ADC 1010a outputs a first digital output signal set Do1 to the first N-bit latch 1012a. The second N-bit flash ADC 1010b outputs a second digital output signal set Do2 to the second N-bit latch 1012b. Other details of each of the N-bit flash ADCs 1010a, 1010b can be as described above in connection with FIG. 6B.

The first N-bit latch 1012a is configured to receive the first digital output signal set Do1 from the first N-bit flash ADC 1010a, and latches the first digital output signal set Do1. The first N-bit latch 1012a provides the latched first digital output signal set Do1 to the multiplexer 1015 for a first time period which can last, for example, at least part of a clock cycle. The second N-bit latch 1012b is configured to receive the second digital output signal set Do2 from the second N-bit flash ADC 1010b, and latches the second digital output signal set Do2. The second N-bit latch 1012b provides the latched second digital output signal set Do2 to the multiplexer 1015 for a second time period which alternates with the first time period. In one embodiment, each of the first and second latches 1012a, 1012b can include a latched flip-flop.

The multiplexer 1015 is configured to receive the first and second digital output signal sets Do1, Do2 from the first and second latches 1012a, 1012b, and selectively output one of the signal sets Do1, Do2 in response to a first control signal CT1 from the timing controller 1050. The multiplexer 1015 provides the selected one of the signal sets Do1, Do2 to the data controller 1017.

The data controller 1017 is configured to receive the selected signal set Do1, Do2 and output it to one of the first to fourth capacitor blocks 1020a-1020d, in response to a second control signal CT2 from the timing controller 1050. Other details of the data controller 1017 can be as described above with respect to the data controller 917 of FIG. 9.

Figure 10B:
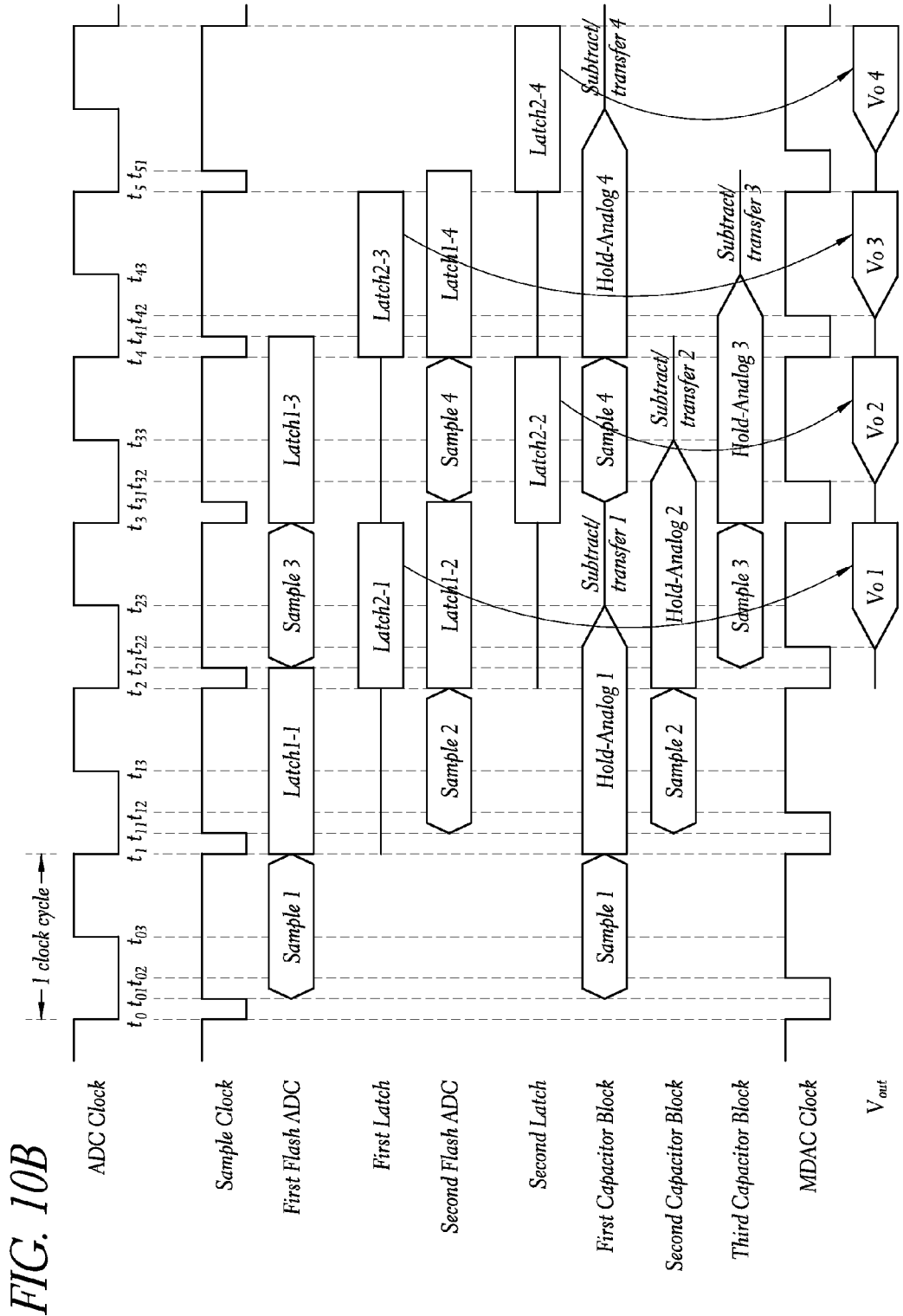
FIG. 10B is a timing diagram illustrating the operation of the MDAC stage of FIG. 10A.

Referring to FIG. 10B, the operation of the MDAC stage 1000 of FIG. 10A will be described below. Before t0, an ADC clock signal ADC CLK, a sample clock signal, and an MDAC clock signal are high. At t0, the ADC clock signal ADC CLK, the sample clock signal, and the MDAC clock signal go low. At t01, the ADC clock signal ADC CLK and the MDAC clock signal are still low, but the sample clock signal goes high. At time t02, the MDAC clock signal goes high. At time t03, the ADC clock signal ADC CLKgoes high. At time t1, the ADC clock signal ADC CLK, the sample clock signal, and the MDAC clock signal go low, completing one clock cycle. The ADC clock signal ADC CLK, the sample clock signal, and the MDAC clock signal repeat transitioning as described above.0

At t01 at which the sample clock goes high, the first flash ADC 1010*a* goes into a sample phase to convert the input voltage Vin (hereinafter, "Sample 1") into a first digital signal (hereinafter "Latch1-1"). In addition, the first capacitor block 1020*a* can be selected by the timing controller 1050, and go into a sample phase by coupling to the first node N1. The first capacitor block 1020*a* thus starts sampling the input voltage Vin (Sample 1) at t01. During a time period between t01 and t1, the first flash ADC 1010*a* and the first capacitor block 1020*a* maintain the sample phase.

During a period between t1 and t21, the first flash ADC 1010*a* latches the first digital signal (Latch1-1). At time t2, the latched first digital signal (Latch1-1) is provided to the first latch 1012*a*. The first latch 1012*a* latches the first digital signal (hereinafter, "Latch2-1") during a period between t2 and t3, and provides the first digital signal (Latch2-1) to the first capacitor block 1020*a* for selecting a reference voltage.

At time t1, the first capacitor block 1020*a* is disconnected from the first node N1. During a period between t1 and t2, the first capacitor block 1020*a* holds the sampled input voltage (Sample 1). During another period between t22 and t3, the first capacitor block 1020*a* subtracts the selected reference voltage from the sampled input voltage (Sample 1), and outputs a resulting residue voltage to the amplifier 1030. The amplifier 1030 outputs the output voltage Vout based on the Sample 1 during a period between t22 and t3 with a delay of about 2 clock cycles.

While the first flash ADC 1010*a*, the first latch 1012*a*, and the first capacitor block 1020*a* are performing the operation described above, the second flash ADC 1010*b*, the second latch 1012*b*, and the second capacitor block 1020*b* can perform an operation described below. At t11 at which the sample clock goes high, the second flash ADC 1010*b* goes into a sample phase to convert the input voltage Vin (hereinafter, "Sample 2") into a second digital signal (hereinafter "Latch1-2"). In addition, the second capacitor block 1020*b* can be selected by the timing controller 1050, and go into a sample phase by coupling to the first node N1. The second capacitor block 1020*b* thus starts sampling the input voltage Vin (Sample 2) at t11. During a time period between t11 and t2, the second flash ADC 1010*b* and the second capacitor block 1020*b* maintain the sample phase.

During a period between t2 and t31, the second flash ADC 1010*b* latches the second digital signal (Latch1-2). At time t3, the latched second digital signal (Latch1-2) is provided to the second latch 1012*b*. The second latch 1012*b* latches the second digital signal (hereinafter, "Latch2-2") during a period between t3 and t4, and provides the second digital signal (Latch2-2) to the second capacitor block 1020*b* for selecting a reference voltage.

At time t2, the second capacitor block 1020*b* is disconnected from the first node N1. During a period between t2 and t3, the second capacitor block 1020*b* holds the sampled input voltage (Sample 2). During another period between t32 and t4, the second capacitor block 1020*b* subtracts the selected reference voltage from the sampled input voltage (Sample 2), and outputs a resulting residue voltage to the amplifier 1030.

The amplifier 1030 outputs the output voltage Vout based on the Sample 2 during a period between t32 and t4 with a delay of about 2 clock cycles.

While the second flash ADC 1010*b*, the second latch 1012*b*, and the second capacitor block 1020*b* are performing the operation described above, the first flash ADC 1010*a*, the first latch 1012*a*, and the third capacitor block 1020*c* can perform another operation described below. At t21 at which the sample clock goes high, the first flash ADC 1010*a* goes into another sample phase to convert the input voltage Vin (hereinafter, "Sample 3") into a third digital signal (hereinafter "Latch1-3"). In addition, the third capacitor block 1020*c* can be selected by the timing controller 1050, and go into a sample phase by coupling to the first node N1. The third capacitor block 1020*c* thus starts sampling the input voltage Vin (Sample 3) at time t21. During a time period between t21 and t3, the first flash ADC 1010*a* and the third capacitor block 1020*c* maintain the sample phase.

During a period between t3 and t41, the first flash ADC 1010*a* latches the third digital signal (Latch1-3). At time t4, the latched first digital signal (Latch1-3) is provided to the first latch 1012*a*. The first latch 1012*a* latches the third digital signal (hereinafter, "Latch2-3") during a period between t4 and t5, and provides the third digital signal (Latch2-3) to the third capacitor block 1020*c* for selecting a reference voltage.

At time t3, the third capacitor block 1020*c* is disconnected from the first node N1. During a period between t3 and t4, the third capacitor block 1020*c* holds the sampled input voltage (Sample 3). During another period between t42 and t5, the third capacitor block 1020*c* subtracts the selected reference voltage from the sampled input voltage (Sample 3), and outputs a resulting residue voltage to the amplifier 1030. The amplifier 1030 outputs the output voltage Vout based on the Sample 3 during a period between t42 and t5 with a delay of about 2 clock cycles.

While the first flash ADC 1010*a*, the first latch 1012*a*, and the third capacitor block 1020*c* are performing the operation described above, the second flash ADC 1010*b*, the second latch 1012*b*, and a selected capacitor block can perform an operation similar to the operations described above. The selected capacitor block can be the first capacitor block 1020*a* or the fourth capacitor block 1020*d*. Other details of the operations of each of the components 1015, 1017, 1020*a*-1020*d*, 1030, 1050 can be as described earlier in connection with FIGS. 7A-8.

In the description above, the first flash ADC 1010*a* operates with the first and third capacitor blocks 1020*a*, 1020*c*, while the second flash ADC 1010*b* operates with the third capacitor blocks 1010*c*. However, the timing controller 1050 and the data controller 1017 can randomly select any of the capacitor block for either the first or second flash ADC 1010*a*, 1010*b* as long as a capacitor block is not selected twice within three clock cycles. The random selection of capacitor blocks can avoid a problem due to differences, if any, between the capacitor blocks, as in the embodiments of FIGS. 8 and 9.

N-Bit MDAC Stage of a Pipelined ADC with a Dual-Latch Flash ADC

Referring to FIGS. 11A-11D, an MDAC stage according to another embodiment will be described below. The illustrated MDAC stage 1100 is an N-bit MDAC stage, which includes an N-bit dual latch flash ADC 1110, a multiplexer 1115, a capacitor block 1120, an amplifier 1130, an amplifier capacitor Camp, an analog delay 1140, a first switch SW1, an output switch SW0, and first to third nodes N1-N3. Details of the capacitor block 1120, the amplifier 1130, the amplifier capacitor Camp, the analog delay 1140, the first switch SW1, the output switch SW0, and the first to third nodes N1-N3 can be as described above with respect to those of the capacitor block 620, the amplifier 630, the amplifier capacitor Camp, the analog delay 640, the first switch SW1, the output switch SW0, and the first to third nodes N1-N3 of FIG. 6A.

The N-bit dual latch flash ADC 1110 serves to quantize an input analog voltage Vin (or a residue analog voltage from an immediately preceding stage) to N bits. N may be an integer equal to or greater than 1, or optionally 1.5. The flash ADC 1110 can include n number of dual latch comparators. n may be $2^N$, $2^N-1$, or $2^N-2$, depending on the design of the ADC. The N-bit dual latch flash ADC 1110 can alternately provide first and second digital output signal sets Do1, Do2 in response to the input analog voltage Vin. Details of the N-bit dual latch flash ADC 1110 will be described later in connection with FIGS. 11B-11D.

The multiplexer 1115 receives the first and second digital output signal sets Do1, Do2, and selectively outputs one of the signal sets Do1, Do2 in response to a control signal and/or a clock signal CLK. The multiplexer 1115 provides the selected one of the signal sets Do1, Do2 to the capacitor block 1120 and a control and correction logic (not shown). Other details of the multiplexer 1115 can be as described above with respect to those of the multiplexer 615 of FIG. 6A.

FIG. 11B illustrates one embodiment of an N-bit dual latch flash ADC. The illustrated dual latch flash ADC 1110 includes first to n-th dual latch comparators 1111a-1111n. Each of the first to n-th comparators 1111a-1111n is configured to receive the input analog voltage Vin, and to compare the input analog voltage Vin with a respective one of reference voltages to provide digital output signals D1a, D1b, D2a, D2b, ..., Dia, Dib, ..., Dna, and Dnb. In the illustrated embodiment, the first to n-th dual latch comparators 1111a-1111n outputs a first set of digital output signals D1a, D2a, ..., Dia, ..., and Dna during a clock cycle, and a second set of digital output signals D1b, D2b, Dib, ..., and Dnb during an immediately subsequent clock cycle.

Referring to FIG. 11C, one embodiment of one of the dual latch comparators of FIG. 11B will be described below. The illustrated dual latch comparator 1111i is the i-th dual latch comparator of FIG. 11C, and the other dual latch comparators 1111a, 1111b, ..., 1111n can have the same configuration as the i-th dual latch comparator 1111i. In the illustrated embodiment, the dual latch comparator 1111i can include a pre-amplifier 1112, a demultiplexer 1113, a first latch 1114a, and a second latch 1114b.

The pre-amplifier 1112 is configured to receive the input analog voltage Vin and an i-th reference voltage $V_{REFi}$. The pre-amplifier 1112 is further configured to amplify the voltages Vin, $V_{REFi}$ and provide the amplified voltages Vin, $V_{REFi}$ to the demultiplexer 1113.

The demultiplexer 1113 is configured to provide the amplified voltages Vin, $V_{REFi}$ alternately to either the first latch 1114a or the second latch 1114b, in response to a demultiplexer control signal $C_{DEMUX}$. For example, the demultiplexer 1113 can provide the amplified voltages Vin, $V_{REFi}$ to the first latch 1114a during a clock cycle, and to the second latch 1114b during an immediately subsequent clock cycle.

Each of the first and second latches 1114a, 1114b is configured to compare the amplified input analog voltage Vin with the i-th reference voltage $V_{REFi}$, and hold the comparison result, thereby outputting a digital output signal Dia or Dib.

Figure 11A:
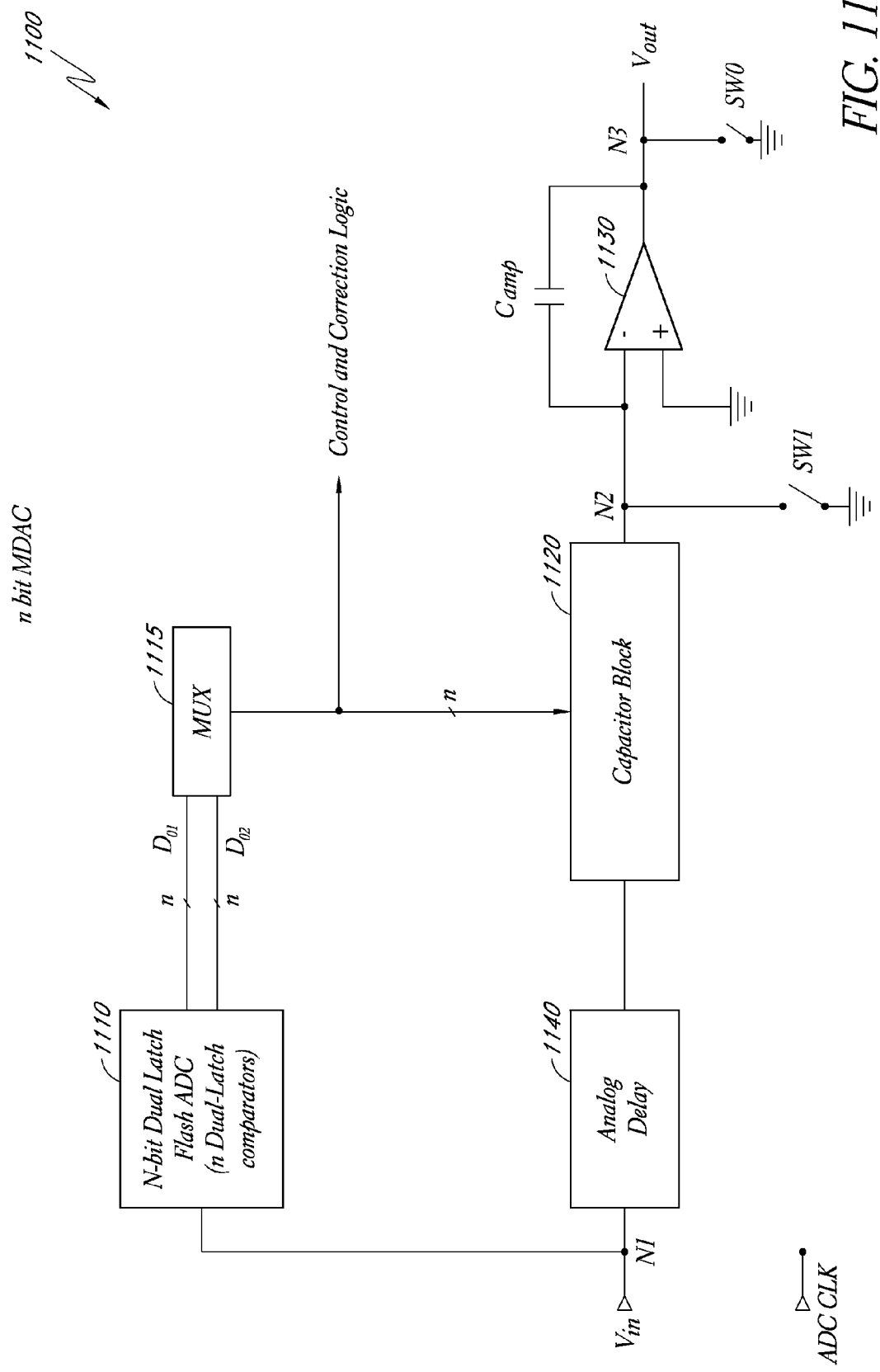
FIG. 11A is a schematic block diagram of an N-bit MDAC including a dual latch flash ADC according to one embodiment.
Figure 11D:
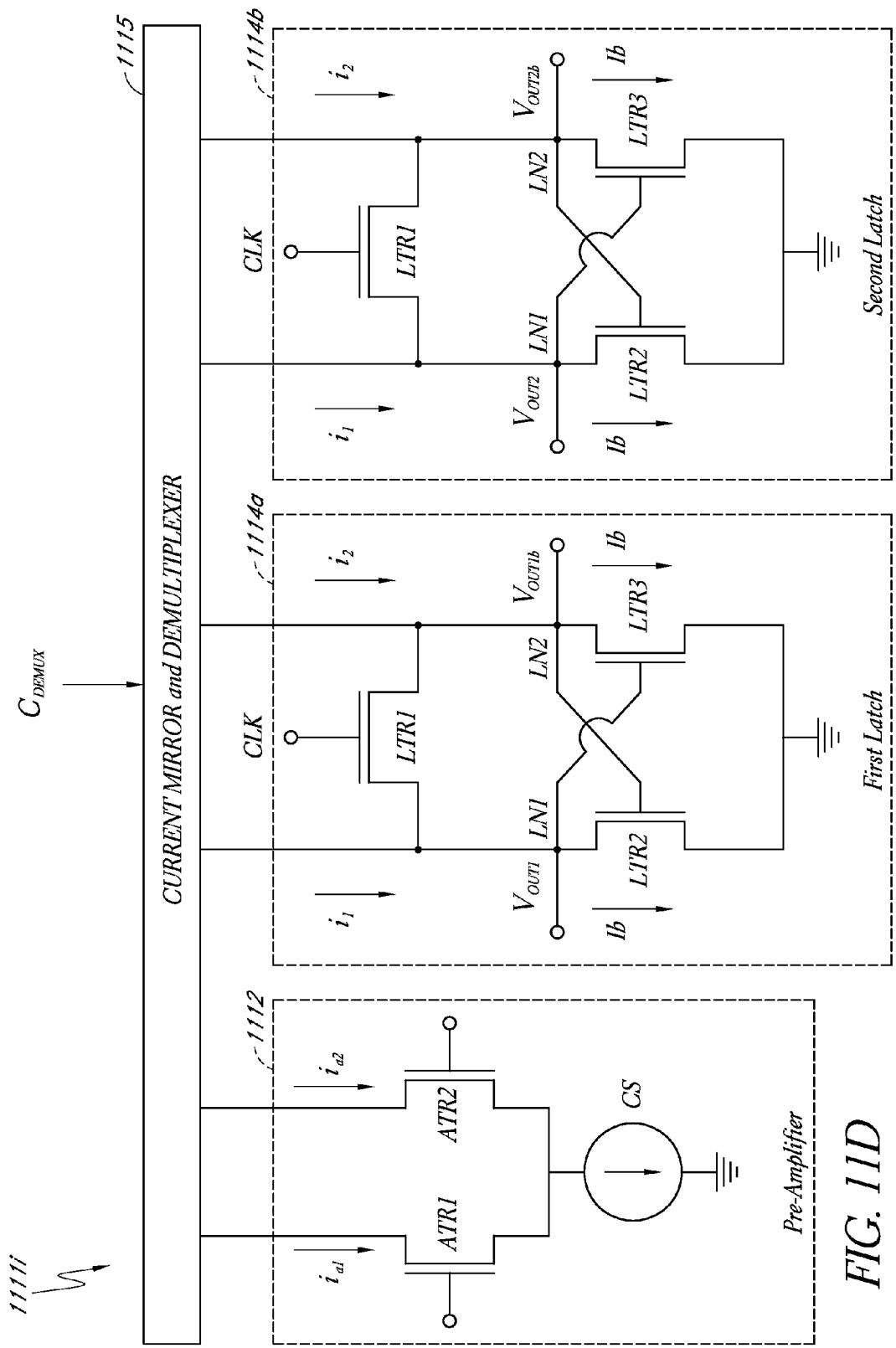
FIG. 11D is a circuit diagram of the dual latch comparator of FIG. 11C according to one embodiment.

Referring to FIG. 11D, one example of a circuit for the dual latch comparator 1111i of FIG. 11C will be described below. The illustrated circuit 1111i includes a pre-amplifier 1112, a first latch 1114a, a second latch 1114b, and a current mirror and demultiplexer 1115. Details of the pre-amplifier 1112 can be as described above with respect to the pre-amplifier 310 of FIG. 3B. In addition, details of each of the first and second latches 1114a, 1114b can be as described above with respect to the latch 320 of FIG. 3B.

The current mirror and multiplexer 1115 serves to copy currents from the pre-amplifier 1112, and provide the copied currents alternately to the first or second latch 1114a, 1114b. A skilled artisan will appreciate that various configurations of current mirrors and demultiplexers can be adapted for the current mirror and demultiplexer 1115.

During operation, each of the gates of the first and second amplifier transistors ATR1, ATR2 of the pre-amplifier 1112 receives a respective one of the input analog voltage Vin and a reference voltage. Depending on the levels of the input analog voltage Vin and the reference voltage, the first and second amplifier transistors ATR1, ATR2 allow first and second amplifier currents $i_{a1}$, $i_{a2}$ to flow therethrough. The first and second amplifier currents $i_{a1}$, $i_{a2}$ are copied and provided alternately to the first or second latch 1114a, 1114b by the current mirror and demultiplexer 1115.

The first and second latches 1114a, 1114b alternately compare the input analog voltage Vin with the reference voltage, and hold the comparison results in response to a clock signal CLK, thereby outputting first or second digital output signals $V_{OUT1}$, $V_{OUT1b}$ or $V_{OUT2}$, $V_{OUT2b}$. For example, the first latch 1114a can compare the input analog voltage Vin with the reference voltage, and latch the comparison result during a clock cycle, while the second latch 1114b can compare the input analog voltage Vin with the reference voltage, and latch the comparison result during an immediately subsequent clock cycle. Other details of the operation of each of the first and second latches 1114a, 1114b can be as described above with respect to the latch 320 of FIG. 3B.

The overall operation of the N-bit MDAC stage 1100 of FIG. 11A can be substantially the same as the operation of the MDAC stage 600 of FIG. 6A, except that a dual latch flash ADC is used instead of two flash ADCs. Thus, a skilled artisan will readily appreciate that the timing diagram of FIG. 5B can apply to the operation of the N-bit MDAC 1100 of FIG. 11A.

Figure 12:
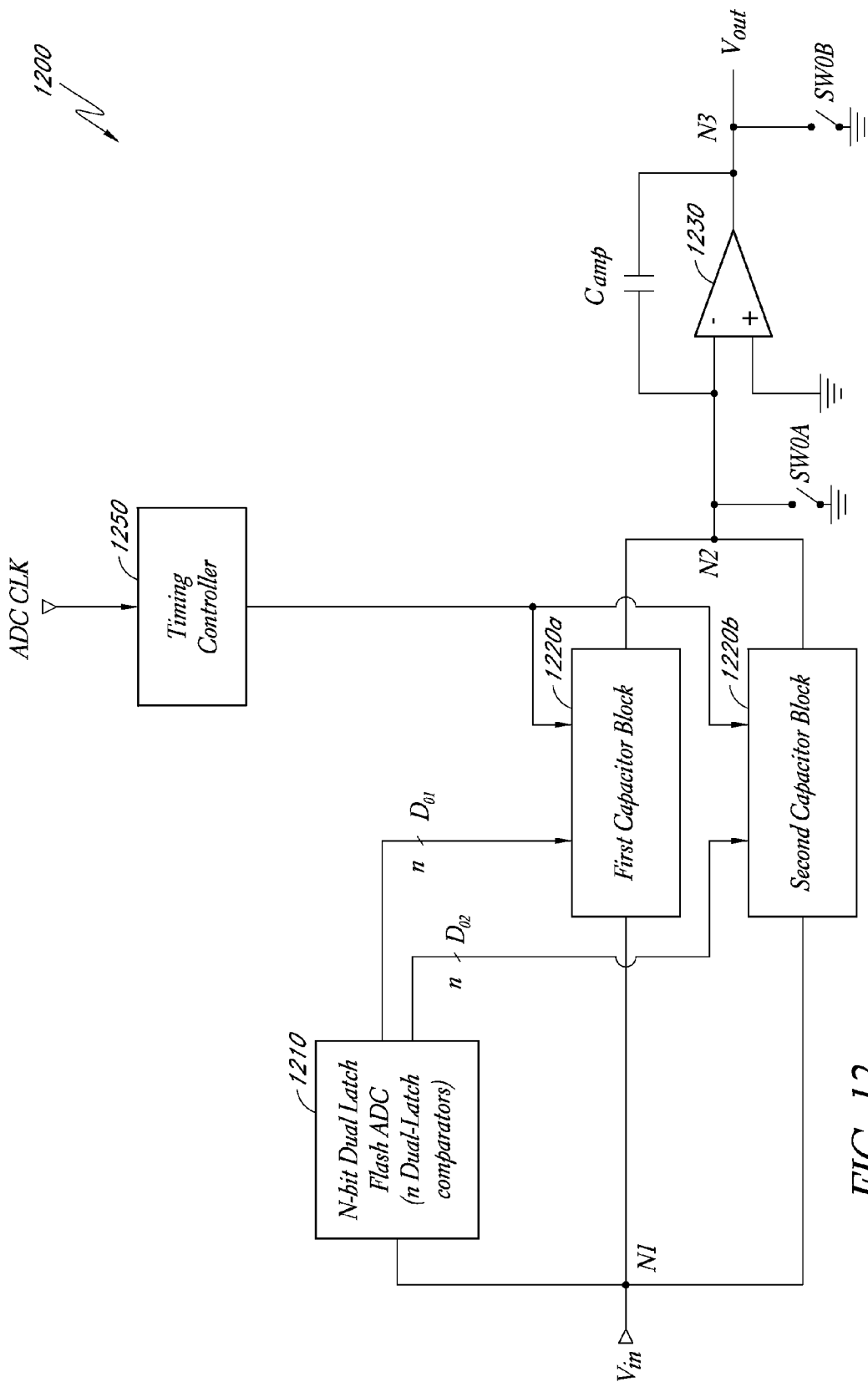
FIG. 12 is a schematic block diagram of an N-bit MDAC including a dual latch flash ADC according to another embodiment.

Referring to FIG. 12, another embodiment of an N-bit MDAC stage 1200 will be described below. The illustrated MDAC 1200 is an N-bit MDAC which includes an N-bit dual latch flash ADC 1210, a first capacitor block 1220a, a second capacitor block 1220b, an amplifier 1230, an amplifier capacitor Camp, a timing controller 1250, first and second output switches SW0A, SW0B, and first to third nodes N1-N3. Details of the first capacitor block 1220a, the second capacitor block 1220b, the amplifier 1230, the amplifier capacitor Camp, the output switches SW0A, SW0B can be as described above with respect to those of the first capacitor block 720a, the second capacitor block 720b, the amplifier 730, the amplifier capacitor Camp, the output switches SW0A, SW0B of FIG. 7A. Further, details of the N-bit dual latch flash ADC 1210 can be as described above with respect to the N-bit dual latch flash ADC 1110 in connection with FIGS. 11A-11D.

The overall operation of the N-bit MDAC stage 1200 of FIG. 12 can be substantially the same as the operation of the MDAC stage 700 of FIG. 7A, except that a dual latch flash ADC is used instead of two flash ADCs. Thus, a skilled artisan will readily appreciate that the timing diagram of FIG. 7B can apply to the operation of the N-bit MDAC 1200.

In another embodiment, an N-bit MDAC stage can include the same configuration as that of the MDAC stage 800 of FIG. 8 except that the two flash ADCs 810a, 810b are replaced with a single dual latch flash ADC that was described earlier in connection with FIGS. 11A-11D. The overall operation of such an MDAC stage can be substantially the same as the operation of the MDAC stage 800 of FIG. 8, except that a dual latch flash ADC is used instead of two flash ADCs.

In yet another embodiment, an N-bit MDAC stage can include the same configuration as that of the MDAC stage 900 of FIG. 9 except that the three flash ADCs 910a-910c are replaced with a single multiple latch flash ADC. The multiple latch flash ADC can include a plurality of multiple latch comparators, each of which includes a single pre-amplifier, a demultiplexer, and multiple latches (for example, three latches if used for the MDAC stage 900 of FIG. 9). The configuration of the multiple latch comparator can be the same as that of the dual latch comparator described above in connection with FIGS. 11C and 11D except that more than two latches are used, instead of two latches. The overall operation of such an MDAC stage can be substantially the same as the operation of the MDAC stage 900 of FIG. 9, except that a multiple latch flash ADC is used instead of three flash ADCs.

In yet another embodiment, an N-bit MDAC stage can include the same configuration as that of the MDAC stage 1000 of FIG. 10A except that the two flash ADCs 1010a, 1010b are replaced with a single dual latch flash ADC that was described earlier in connection with FIGS. 11A-11D. The overall operation of such an MDAC stage can be substantially the same as the operation of the MDAC stage 1000 of FIG. 10A, except that a dual latch flash ADC is used instead of two flash ADCs.

Applications

Pipelined ADCs employing the above described schemes can be implemented into various electronic devices. Examples of the electronic devices can include, but are not limited to, consumer electronic products, parts of the consumer electronic products, electronic test equipments, etc. Examples of the electronic devices can also include memory chips, memory modules, circuits of optical networks or other communication networks, and disk driver circuits. The consumer electronic products can include, but are not limited to, a mobile phone, cellular base stations, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a pipelined analog-to-digital converter comprising a control and correction circuit; and
a plurality of multiplying digital-to-analog converter (MDAC) stages coupled in cascade to one another, wherein at least one of the MDAC stages comprises:
an MDAC input configured to receive an analog input voltage; and
a dual latch flash analog-to-digital converter (ADC) comprising one or more dual latch comparators, each of the dual latch comparators being configured to receive the MDAC input and a respective one of different reference voltages, each of the dual latch comparators comprising:
a pre-amplifier having an input coupled to the MDAC input and the respective one of different reference voltages to provide a pre-amplified MDAC input and a pre-amplified reference voltage, and an output;
a demultiplexer having an input coupled to the output of the pre-amplifier, a first output, and a second output, wherein the demultiplexer is configured to provide the pre-amplified MDAC input and the pre-amplified reference voltage alternately via the first or second output;
a first latch having an input coupled to the first output of the demultiplexer, wherein the first latch is configured to generate a first digital signal; and
a second latch having an input coupled to the second output of the demultiplexer, wherein the second latch is configured to generate a second digital signal,
wherein the first latch and the second latch alternate analog-to-digital conversion in response to control from the control and correction circuit.

2. The apparatus of claim 1, wherein the at least one of the MDAC stages further comprises:
a third latch configured to receive and latch the first digital signal from the first latch, and to output a first latched digital signal; and
a fourth latch configured to receive and latch the second digital signal from the second latch, and to output a second latched digital signal.

3. An apparatus comprising:
a pipelined analog-to-digital converter comprising a control and correction circuit; and
a plurality of multiplying digital-to-analog converter (MDAC) stages coupled in cascade to one another, wherein at least one of the MDAC stages comprises:
an MDAC input configured to receive an analog input voltage;
a dual latch flash analog-to-digital ADC comprising one or more dual latch comparators, at least one of the dual latch comparators comprising:
a pre-amplifier having an input coupled to the MDAC input, and an output;
a demultiplexer having an input coupled to the output of the pre-amplifier, a first output, and a second output;
a first latch having an input coupled to the first output of the demultiplexer, wherein the first latch is configured to generate a first digital signal; and
a second latch having an input coupled to the second output of the demultiplexer, wherein the second latch is configured to generate a second digital signal,
wherein the first latch and the second latch alternate analog-to-digital conversion in response to control from the control and correction circuit,
wherein the at least one of the MDAC stages further comprises:
a delay circuit configured to delay the analog input voltage to generate a delayed input voltage;

a capacitor block configured to sample and hold the delayed input voltage, the capacitor block being further configured to subtract a reference voltage from the delayed input voltage to generate a residue signal; and an amplifier configured to amplify the residue signal.

4. The apparatus of claim 3, wherein the at least one of the MDAC stages further comprises one or more multiplexers having inputs coupled to outputs of the first and second latches, and wherein the one or more multiplexers are configured to alternately provide the first and second digital signals to the capacitor block for control of one or more reference voltages for the capacitor block.

5. An apparatus comprising:
a pipelined analog-to-digital converter comprising a control and correction circuit; and
a plurality of multiplying digital-to-analog converter (MDAC) stages coupled in cascade to one another, wherein at least one of the MDAC stages comprises:
an MDAC input configured to receive an analog input voltage; and
a dual latch flash analog-to-digital converter (ADC) comprising one or more dual latch comparators, at least one of the dual latch comparators comprising:
a pre-amplifier having an input coupled to the MDAC input, and an output;
a demultiplexer having an input coupled to the output of the pre-amplifier, a first output, and a second output;
a first latch having an input coupled to the first output of the demultiplexer, wherein the first latch is configured to generate a first digital signal; and
a second latch having an input coupled to the second output of the demultiplexer, wherein the second latch is configured to generate a second digital signal,
wherein the first latch and the second latch alternate analog-to-digital conversion in response to control from the control and correction circuit,
wherein the at least one of the MDAC stages further comprises:
a first capacitor block configured to sample and hold the input voltage, the first capacitor block being further configured to subtract a reference voltage from the input voltage in response to the first digital signal to generate a first residue signal;
a second capacitor block configured to sample and hold the input voltage, the second capacitor block being further configured to subtract a reference voltage from the input voltage in response to the second digital signal to generate a second residue signal; and
an amplifier configured to alternately amplify the first and second residue signals.

6. The apparatus of claim 5, wherein the at least one of the MDAC stages further comprises a timing controller configured to allow the first capacitor block to output the first residue signal at least partly during a cycle or phase of a clock signal, the timing controller being further configured to allow the second capacitor block to output the second residue signal at least partly during an alternate cycle or phase of the clock signal.

7. An apparatus comprising:
a pipelined analog-to-digital converter comprising a control and correction circuit; and
a plurality of multiplying digital-to-analog converter (MDAC) stages coupled in cascade to one another, wherein at least one of the MDAC stages comprises:
an MDAC input configured to receive an analog input voltage; and
a dual latch flash analog-to-digital converter (ADC) comprising one or more dual latch comparators, at least one of the dual latch comparators comprising:
a pre-amplifier having an input coupled to the MDAC input, and an output;
a demultiplexer having an input coupled to the output of the pre-amplifier, a first output, and a second output;
a first latch having an input coupled to the first output of the demultiplexer, wherein the first latch is configured to generate a first digital signal; and
a second latch having an input coupled to the second output of the demultiplexer wherein the second latch is configured to generate a second digital signal,
wherein the first latch and the second latch alternate analog-to-digital conversion in response to control from the control and correction circuit,
wherein the at least one of the MDAC stages further comprises:
a first capacitor block configured to sample and hold the input voltage, the first capacitor block being further configured to subtract a reference voltage from the input voltage in response to one of the first and second digital signals to generate a first residue signal;
a second capacitor block configured to sample and hold the input voltage, the second capacitor block being further configured to subtract a reference voltage from the input voltage in response to one of the first and second digital signals to generate a second residue signal; and
a third capacitor block configured to sample and hold the input voltage, the third capacitor block being further configured to subtract a reference voltage from the input voltage in response to one of the first and second digital signals to generate a third residue signal.

8. The apparatus of claim 7, wherein the at least one of the MDAC stages further comprises:
a multiplexer having inputs coupled to outputs of the first and second latches, the multiplexer being configured to select one of the first and second digital signals; and
a data controller configured to select one of the first to third capacitor blocks, and to pass the selected digital signal to the selected capacitor block.

9. The apparatus of claim 8, wherein the multiplexer is further configured to alternately provide the first and second digital signals, and wherein the data controller is configured to randomly select one of the first to third capacitor blocks such that no capacitor block is selected consecutively.

10. An apparatus comprising:
a pipelined analog-to-digital converter comprising a control and correction circuit; and
a plurality of multiplying digital-to-analog converter (MDAC) stages coupled in cascade to one another, wherein at least one of the MDAC stages comprises:
an MDAC input configured to receive an analog input voltage; and
a dual latch flash analog-to-digital converter (ADC) comprising one or more dual latch comparators, at least one of the dual latch comparators comprising:
a pre-amplifier having an input coupled to the MDAC input, and an output;
a demultiplexer having an input coupled to the output of the pre-amplifier, a first output, and a second output;

a first latch having an input coupled to the first output of the demultiplexer, wherein the first latch is configured to generate a first digital signal; and a second latch having an input coupled to the second output of the demultiplexer, wherein the second latch is configured to generate a second digital signal, wherein the first latch and the second latch alternate analog-to-digital conversion in response to control from the control and correction circuit, wherein the demultiplexer further has a third output, wherein the at least one of the dual latch comparators further comprises a third latch having an input coupled to the third output of the demultiplexer, wherein the third latch is configured to generate a third digital signal, and wherein the first latch, the second latch, and the third latch alternate analog-to-digital, conversion in response to control from the control and correction circuit.

11. The apparatus of claim 10, wherein the at least one of the MDAC stages further comprises:

a first capacitor block configured to sample and hold the input voltage, the first capacitor block being further configured to subtract a reference voltage from the input voltage in response to one of the first to third digital signals to generate a first residue signal;

a second capacitor block configured to sample and hold the input voltage, the second capacitor block being further configured to subtract a reference voltage from the input voltage in response to one of the first to third digital signals to generate a second residue signal;

a third capacitor block configured to sample and hold the input voltage, the third capacitor block being further configured to subtract a reference voltage from the input voltage in response to one of the first to third digital signals to generate a third residue signal; and a fourth capacitor block configured to sample and hold the input voltage, the fourth capacitor block being further configured to subtract a reference voltage from the input voltage in response to one of the first to third digital signals to generate a fourth residue signal.

12. The apparatus of claim 11, wherein the at least one of the MDAC stages further comprises:

a multiplexer having inputs coupled to outputs of the first to third latches, the multiplexer being configured to select one of the first to third digital signals; and a data controller configured to select one of the first to fourth capacitor blocks, and to pass the selected digital signal to the selected capacitor block.

13. The apparatus of claim 12, wherein the multiplexer is further configured to alternately provide the first to third digital signals, and wherein the data controller is configured to randomly select one of the first to fourth capacitor blocks such that no capacitor block is selected consecutively.

14. An apparatus comprising:

a pipelined analog-to-digital converter comprising a control and correction circuit; and a plurality of multiplying digital-to-analog converter (MDAC) stages coupled in cascade to one another, wherein at least one of the MDAC stages comprises:

an MDAC input configured to receive an analog input voltage; and a dual latch flash analog-to-digital converter (ADC) comprising one or more dual latch comparators, at least one of the dual latch comparators comprising:

a pre-amplifier having an input coupled to the MDAC input, and an output;

a demultiplexer having an input coupled to the output of the pre-amplifier, a first output, and a second output;

a first latch having an input coupled to the first output of the demultiplexer, wherein the first latch is configured to generate a first digital signal; and a second latch having an input coupled to the second output of the demultiplexer, wherein the second latch is configured to generate a second digital signal, wherein the first latch and the second latch alternate analog-to-digital conversion in response to control from the control and correction circuit, wherein the at least one of the MDAC stages further comprises:

a third latch configured to receive and latch the first digital signal from the first latch, and to output a first latched digital signal; and a fourth latch configured to receive and latch the second digital signal from the second latch, and to output a second latched digital signal, wherein the at least one of the MDAC stages further comprises:

a first capacitor block configured to sample and hold the input voltage, the first capacitor block being further configured to subtract a reference voltage from the input voltage in response to one of the first and second latched digital signals to generate a first residue signal;

a second capacitor block configured to sample and hold the input voltage, the second capacitor block being further configured to subtract a reference voltage from the input voltage in response to one of the first and second latched digital signals to generate a second residue signal;

a third capacitor block configured to sample and hold the input voltage, the third capacitor block being further configured to subtract a reference voltage from the input voltage in response to one of the first and second latched digital signals to generate a third residue signal; and a fourth capacitor block configured to sample and hold the input voltage, the fourth capacitor block being further configured to subtract a reference voltage from the input voltage in response to one of the first and second latched digital signals to generate a fourth residue signal.

15. The apparatus of claim 14, wherein the at least one of the MDAC stages further comprises:

a multiplexer having inputs coupled to outputs of the third and fourth latches, the multiplexer being configured to select one of the first and second latched digital signals; and a data controller configured to select one of the first to fourth capacitor blocks, and to pass the selected digital signal to the selected capacitor block.

16. The apparatus of claim 15, wherein the multiplexer is further configured to alternately provide the first and second latched digital signals, and wherein the data controller is configured to randomly select one of the first to fourth capacitor blocks such that no capacitor block is selected consecutively.

17. A method for pipelined analog-to-digital conversion, the method comprising:

converting a first analog signal into a digital signal;

converting the digital signal into a second analog signal;

subtracting the second analog signal from the first analog signal, thereby generating a residue signal; and amplifying the residue signal;

wherein converting the first analog signal comprises:
pre-amplifying, by a pre-amplifier of a flash ADC, the first analog signal and a reference voltage to generate a pre-amplified first analog signal and a pre-amplified reference voltage;
providing, by a demultiplexer having a first output and a second output, the pre-amplified first analog signal and the pre-amplified reference voltage alternately via the first output or the second output;
comparing, by a first comparator latch of the flash ADC, the pre-amplified first analog signal with the pre-amplified reference voltage to generate a first digital signal during at least part of a first phase or cycle of a clock signal; and
comparing, by a second comparator latch of the flash ADC, the pre-amplified first analog signal with the pre-amplified reference voltage to generate a second digital signal during at least part of a second phase or cycle of a clock signal immediately subsequent to the first phase or cycle.

18. The method of claim 17, further comprising:
latching, by a first latch external to the flash ADC, the first digital signal to generate a first latched digital signal during at least part of the second phase or cycle; and
latching, by a second latch external to the flash ADC, the second digital signal to generate a second latched digital signal during at least part of a third phase or cycle of the clock signal immediately subsequent to the second phase or cycle.

19. A method for pipelined analog-to-digital conversion, the method comprising:
converting a first analog signal into a digital signal;
converting the digital signal into a second analog signal;
subtracting the second analog signal from the first analog signal, thereby generating a residue signal; and
amplifying signal;
wherein converting the first analog signal comprises:
pre-amplifying, by a pre-amplifier of a flash ADC, the first analog signal and a reference voltage;
comparing, by a first comparator latch of the flash ADC, the pre-amplified first analog signal with the pre-amplified reference voltage to generate a first digital signal during at least part of a first phase or cycle of a clock signal; and
comparing, by a second comparator latch of the flash ADC, the pre-amplified first analog signal with the pre-amplified reference voltage to generate a second digital signal during at least part of a second phase or cycle of a clock signal immediately subsequent to the first phase or cycle;
wherein the method further comprises delaying the first analog signal, and wherein converting the digital signal into the second analog signal comprises converting the delayed first analog signal into the second analog signal.

20. The method of claim 19, wherein converting the digital signal comprises: providing the first digital signal to a capacitor block during at least part of the first phase or cycle of the clock signal; and providing the second digital signal to the capacitor block during at least part of the second phase or cycle of the clock signal.

21. A method for pipelined analog-to-digital conversion, the method comprising:
converting a first analog signal into a digital signal;
converting the digital signal into a second analog signal;
subtracting the second analog signal from the first analog signal, thereby generating a residue signal; and
amplifying the residue signal;
wherein converting the first analog signal comprises:
pre-amplifying, by a pre-amplifier of a flash ADC, the first analog signal and a reference voltage;
comparing, by a first comparator latch of the flash ADC, the pre-amplified first analog signal with the pre-amplified reference voltage to generate a first digital signal during at least part of a first phase or cycle of a clock signal; and
comparing, by a second comparator latch of the flash ADC, the pre-amplified first analog signal with the pre-amplified reference voltage to generate a second digital signal during at least part of a second phase or cycle of a clock signal immediately subsequent to the first phase or cycle,
wherein converting the digital signal into the second analog signal comprises:
connecting a first capacitor block to a first reference voltage at least partly in response to the first digital signal during at least part of the first phase or cycle of the clock signal; and
connecting a second capacitor block to a second reference voltage at least partly in response to the second digital signal during at least part of the second phase or cycle of the clock signal.

22. A method for pipelined analog-to-digital conversion, the method comprising:
converting a first analog signal into a digital signal;
converting the digital signal into a second analog signal;
subtracting the second analog signal from the first analog signal, thereby generating a residue signal; and
amplifying the residue signal;
wherein converting the first analog signal comprises:
pre-amplifying, by a pre-amplifier of a flash ADC, the first analog signal and a reference voltage;
comparing, by a first comparator latch of the flash ADC, the pre-amplified first analog signal with the pre-amplified reference voltage to generate a first digital signal during at least part of a first phase or cycle of a clock signal; and
comparing, by a second comparator latch of the flash ADC, the pre-amplified first analog signal with the pre-amplified reference voltage to generate a second digital signal during at least part of a second phase or cycle of a clock signal immediately subsequent to the first phase or cycle,
wherein the method further comprises:
selecting one of three or more capacitor blocks; and
randomly selecting another of the three or more capacitor blocks,
wherein converting the digital signal into the second analog signal comprises:
connecting the selected capacitor block to a first reference voltage at least partly in response to the first digital signal; and
connecting the other randomly selected capacitor block to a second reference voltage at least partly in response to the second digital signal.

23. A method for pipelined analog-to-digital conversion, the method comprising:
converting a first analog signal into a digital signal;
converting the digital signal into a second analog signal;
subtracting the second analog signal from the first analog signal, thereby generating a residue signal; and
amplifying the residue signal;
wherein converting the first analog signal comprises:
pre-amplifying, by a pre-amplifier of a flash ADC, the first analog signal and a reference voltage;

comparing, by a first comparator latch of the flash ADC, the pre-amplified first analog signal with the pre-amplified reference voltage to generate a first digital signal during at least part of a first phase or cycle of a clock signal; and comparing, by a second comparator latch of the flash ADC, the pre-amplified first analog signal with the pre-amplified reference voltage to generate a second digital signal during at least part of a second phase or cycle of a clock signal immediately subsequent to the first phase or cycle, wherein converting the first analog signal further comprises: comparing, by a third comparator latch of the flash ADC, the pre-amplified first analog signal with the pre-amplified reference voltage to generate a third digital signal during at least part of a third phase or cycle of a clock signal immediately subsequent to the second phase or cycle.

24. The method of claim 23, further comprising:

randomly selecting a first capacitor block from three or more capacitor blocks;

randomly selecting a second capacitor block from the three or more capacitor blocks; and randomly selecting a third capacitor block from the three or more capacitor blocks, wherein none of the three or more capacitors is selected consecutively, and wherein converting the digital signal into the second analog signal comprises:

connecting the first capacitor block to a first reference voltage at least partly in response to the first digital signal;

connecting the second capacitor block to a second reference voltage at least partly in response to the second digital signal; and connecting the third capacitor block to a third reference voltage at least partly in response to the third digital signal.

25. A method for pipelined analog-to-digital conversion, the method comprising:

converting a first analog signal into a digital signal;
converting the digital signal into a second analog signal;
subtracting the second analog signal from the first analog signal, thereby generating a residue signal; and
amplifying the residue signal;

wherein converting the first analog signal comprises:
pre-amplifying, by a pre-amplifier of a flash ADC, the first analog signal and a reference voltage;
comparing, by a first comparator latch of the flash ADC, the pre-amplified first analog signal with the pre-amplified reference voltage to generate a first digital signal during at least part of a first phase or cycle of a clock signal; and comparing, by a second comparator latch of the flash ADC, the pre-amplified first analog signal with the pre-amplified reference voltage to generate a second digital signal during at least part of a second phase or cycle of a clock signal immediately subsequent to the first phase or cycle, wherein the method further comprises latching, by a first latch external to the flash ADC, the first digital signal to generate a first latched digital signal during at least part of the second phase or cycle; and latching, by a second latch external to the flash ADC, the second digital signal to generate a second latched digital signal during at least part of a third phase or cycle of the clock signal immediately subsequent to the second phase or cycle, wherein converting the first analog signal further comprises:

comparing, by the first comparator latch of the flash ADC, the pre-amplified first analog signal with the pre-amplified reference voltage to generate a third digital signal during at least part of the third phase or cycle of a clock signal; and latching, by the first latch external to the flash ADC, the third digital signal to generate a third latched digital signal during at least part of a fourth phase or cycle of the clock signal immediately subsequent to the third phase or cycle.

26. The method of claim 25, further comprising:

randomly selecting a first capacitor block from three or more capacitor blocks;

randomly selecting a second capacitor block from the three or more capacitor blocks; and randomly selecting a third capacitor block from the three or more capacitor blocks, wherein none of the three or more capacitors is selected twice within three cycles or phases of a clock cycle, and wherein converting the digital signal into the second analog signal comprises:

connecting the first capacitor block to a first reference voltage at least partly in response to the first latched digital signal;

connecting the second capacitor block to a second reference voltage at least partly in response to the second latched digital signal; and connecting the third capacitor block to a third reference voltage at least partly in response to the third latched digital signal.

* * * * *

UNITED STATES PATENT AND TRADEMARK OFFICE
CERTIFICATE OF CORRECTION

| | | |
|---|---|---|
| PATENT NO. | : 7,965,217 B2 | Page 1 of 1 |
| APPLICATION NO. | : 12/578076 | |
| DATED | : June 21, 2011 | |
| INVENTOR(S) | : Franklin Murden, Scott G. Bardsley and Peter R. Derounian | |

It is certified that error appears in the above-identified patent and that said Letters Patent is hereby corrected as shown below:

At column 19, line 35, please change "D2b, Dib," to --D2b, . . ., Dib,--.

At column 22, line 46, in Claim 3 please change "ADC" to --converter (ADC)--.

At column 24, line 16, in Claim 7 please change "demultiplexer" to --demultiplexer,--.

At column 25, line 18, in Claim 10 please change "digital," to --digital--.

At column 27, line 36, in Claim 19 before "signal;" insert --the residue--.

Signed and Sealed this
Seventeenth Day of January, 2012

David J. Kappos
*Director of the United States Patent and Trademark Office*